United States Patent
Wada et al.

(10) Patent No.: US 8,472,489 B2
(45) Date of Patent: Jun. 25, 2013

(54) LIGHT EMITTING DEVICE

(75) Inventors: Kazumi Wada, Tokyo (JP); Shiyun Lin, Tokyo (JP); Yosuke Kobayashi, Tokyo (JP); Peng Huei Lim, Tokyo (JP)

(73) Assignee: The University of Tokyo (JP)

( * ) Notice: Subject to any disclaimer, the term of this patent is extended or adjusted under 35 U.S.C. 154(b) by 429 days.

(21) Appl. No.: 12/678,953

(22) PCT Filed: Sep. 18, 2008

(86) PCT No.: PCT/JP2008/066845
§ 371 (c)(1), (2), (4) Date: Aug. 16, 2010

(87) PCT Pub. No.: WO2009/038122
PCT Pub. Date: Mar. 26, 2009

(65) Prior Publication Data
US 2011/0044362 A1    Feb. 24, 2011

(30) Foreign Application Priority Data

Sep. 18, 2007 (JP) .................... 2007-241408

(51) Int. Cl.
*H01S 5/00* (2006.01)
*H01S 3/08* (2006.01)
*H01S 3/083* (2006.01)

(52) U.S. Cl.
USPC ............... 372/45.01; 372/92; 372/94

(58) Field of Classification Search
USPC ................................. 372/45.01, 94
See application file for complete search history.

(56) References Cited

U.S. PATENT DOCUMENTS 5,787,106 A * 7/1998 Tabuchi et al. ............ 372/50.1
5,790,583 A   8/1998 Ho
5,825,799 A   10/1998 Ho et al.

(Continued)

FOREIGN PATENT DOCUMENTS

JP    2001-040348 A    2/2001
JP    2001-526000 A    12/2001

(Continued)

OTHER PUBLICATIONS

International Preliminary Report on Patentability for International application No. PCT/JP2008/066845 with English translation issued Apr. 7, 2010.

(Continued)

*Primary Examiner* — Armando Rodriguez
(74) *Attorney, Agent, or Firm* — Cantor Colburn LLP

(57) ABSTRACT

A light-emitting device having a ring optical resonator and capable of laser oscillation by a novel structure realized by working out the mechanism of light emission. The light-emitting device having a ring optical resonator fabricated on a base is characterized in that the optical resonator has a core made of a semiconductor and serving to propagate light and a clad formed on at least the base side of the core in the stack direction out of the base side and the opposite side of the core, at least the ring inner and outer peripheral surfaces of the core are covered with a transparent body having an index of refraction lower than that of the space or the clad, and a part of the ring inner and outer peripheral surfaces of the clad are covered with a transparent body having an index of refraction lower than that of the space or the clad.

8 Claims, 17 Drawing Sheets

U.S. PATENT DOCUMENTS

| | | | |
|---|---|---|---|
| 5,878,070 A | 3/1999 | Ho et al. | |
| 5,926,496 A * | 7/1999 | Ho et al. | 372/92 |
| 6,009,115 A | 12/1999 | Ho | |
| 6,970,619 B2 * | 11/2005 | Baumann et al. | 385/25 |
| 7,099,549 B2 * | 8/2006 | Scheuer et al. | 385/132 |

FOREIGN PATENT DOCUMENTS

| | | |
|---|---|---|
| JP | 2002-350141 A | 12/2002 |
| WO | 96/37932 A1 | 11/1996 |
| WO | 97/44870 A1 | 11/1997 |
| WO | 97/44871 A1 | 11/1997 |
| WO | 98/53535 A1 | 11/1998 |

OTHER PUBLICATIONS

International Search Report for International application No. PCT/JP2008/066845 mailed Dec. 16, 2008 with English translation.

* cited by examiner

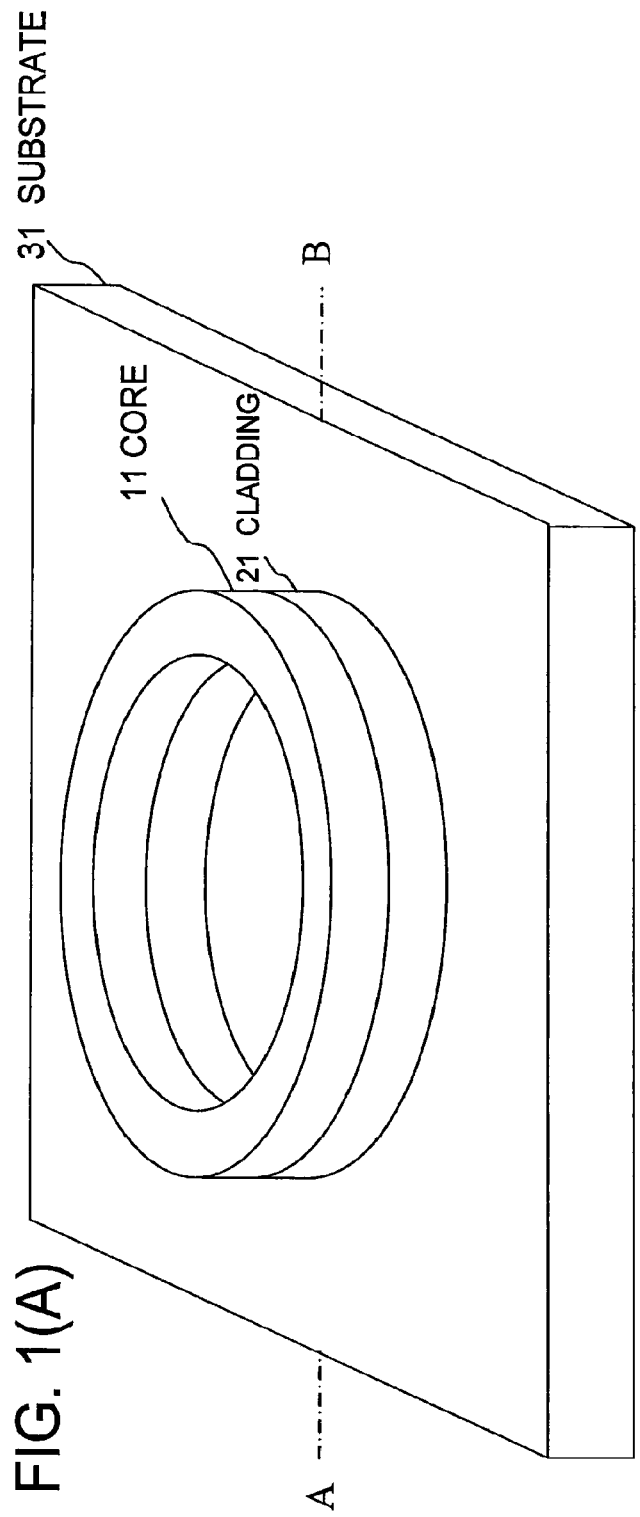
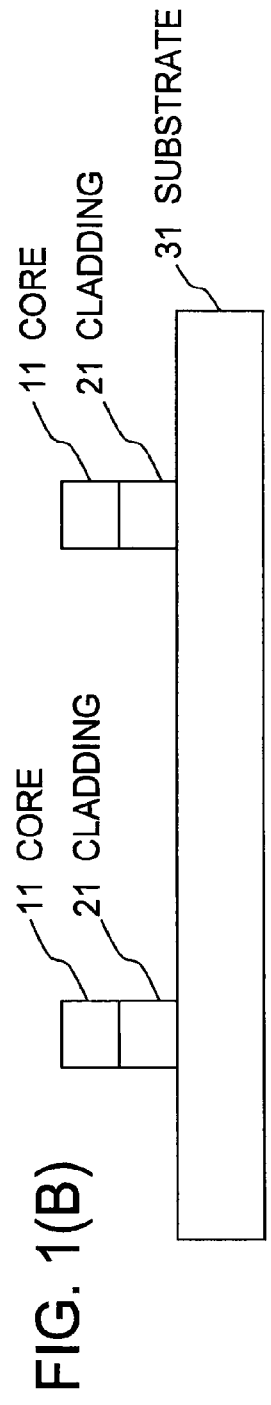
FIG. 1(A)
FIG. 1(B)

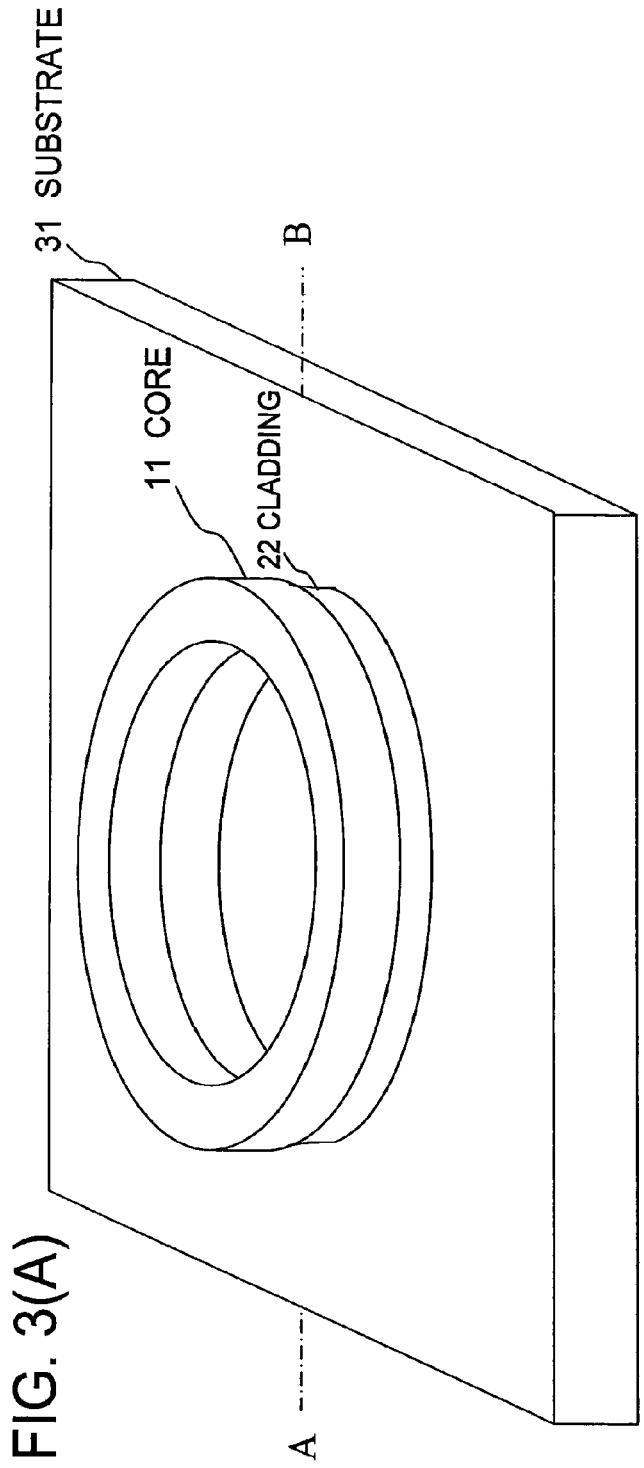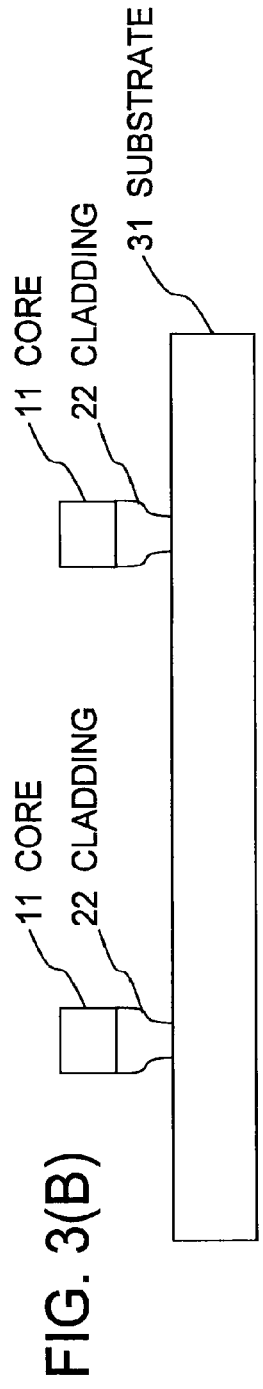
FIG. 3(A)
FIG. 3(B)

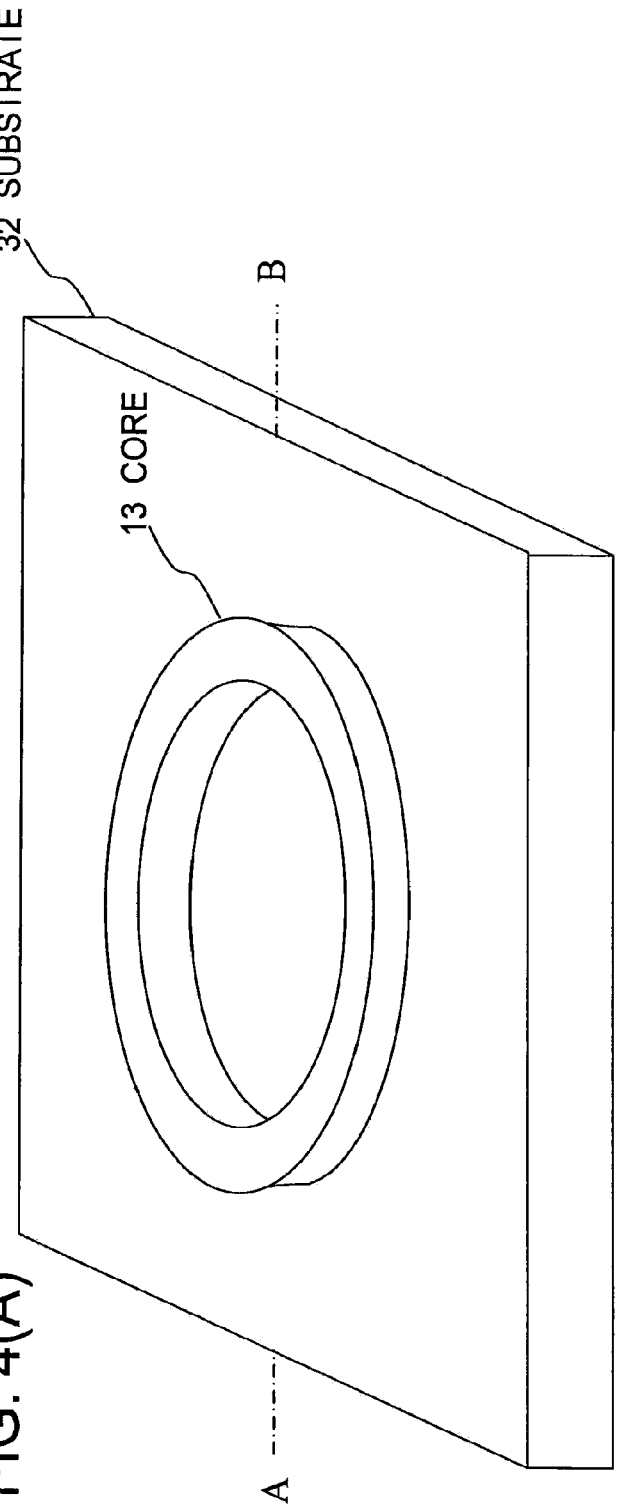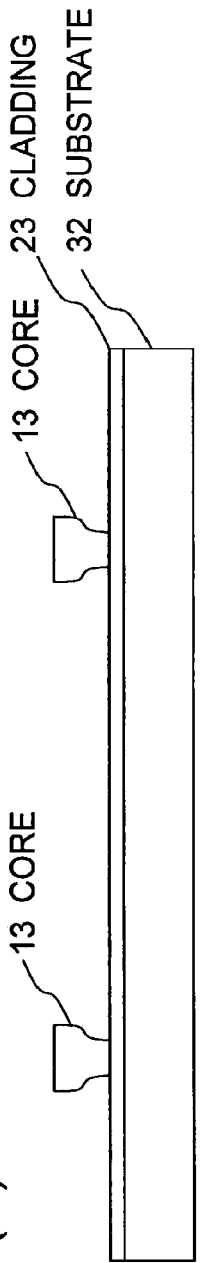
FIG. 4(A)
FIG. 4(B)

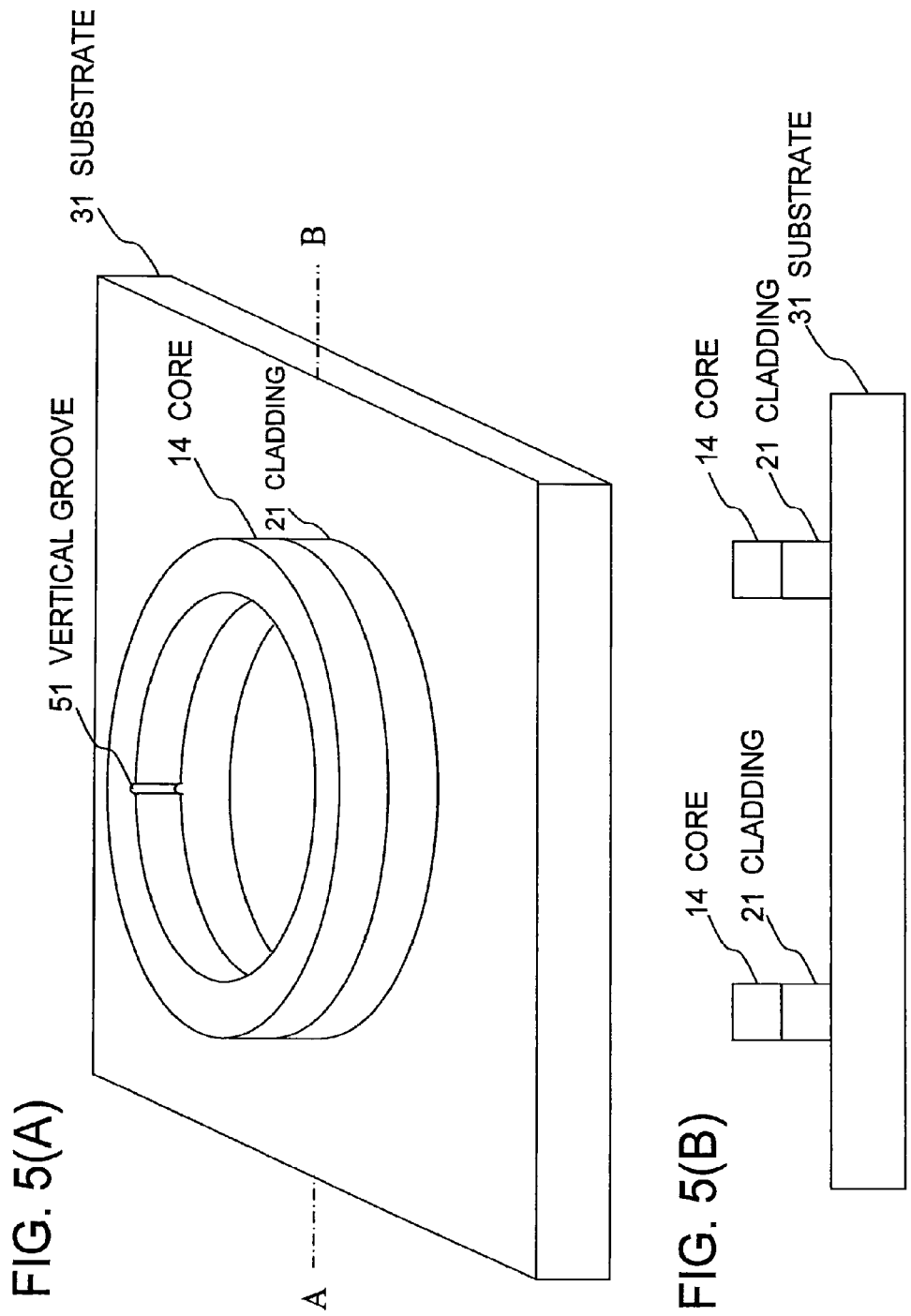

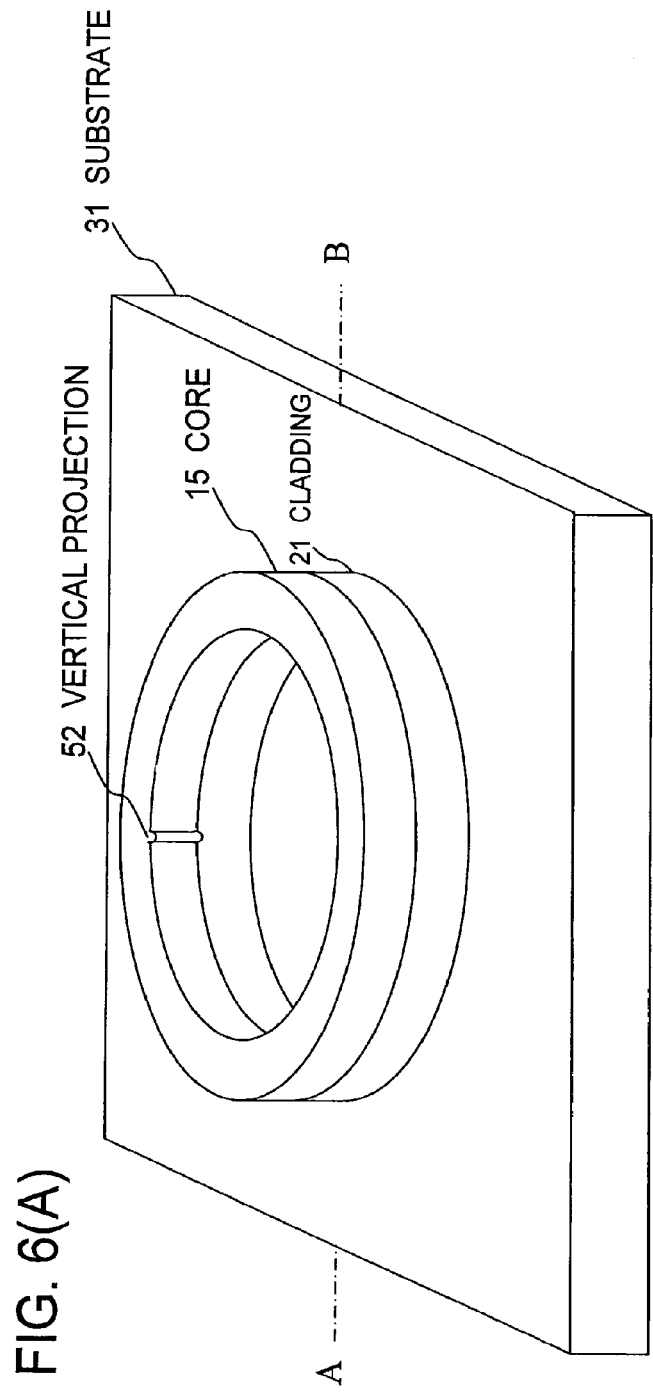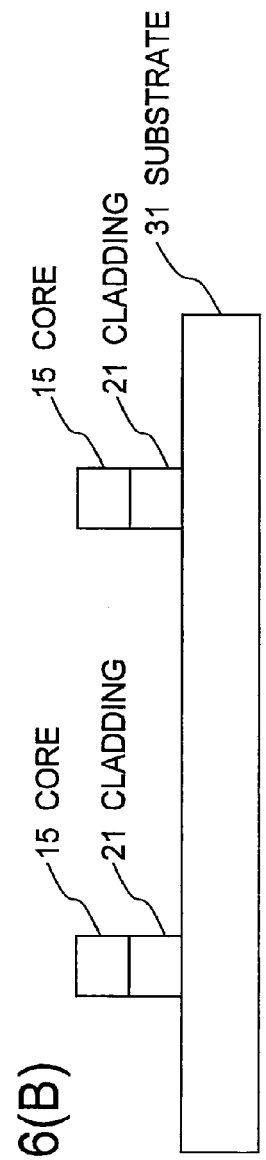

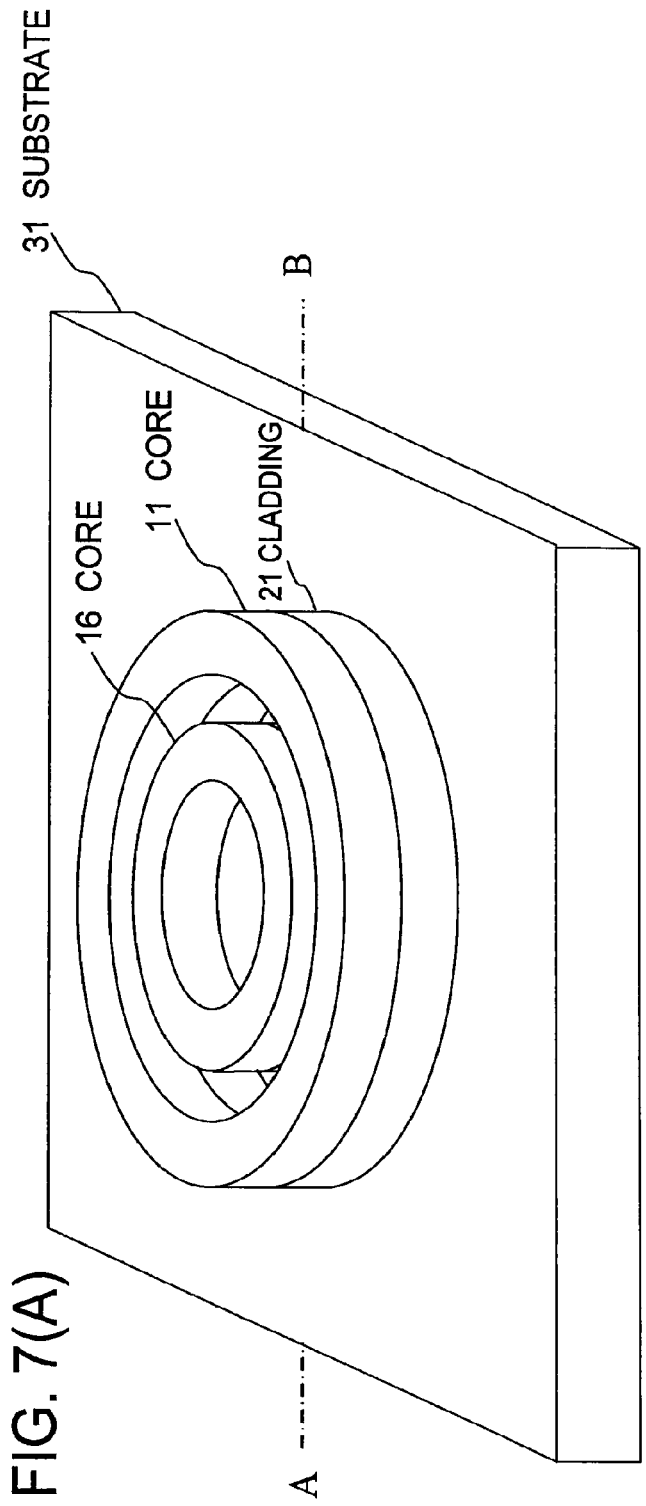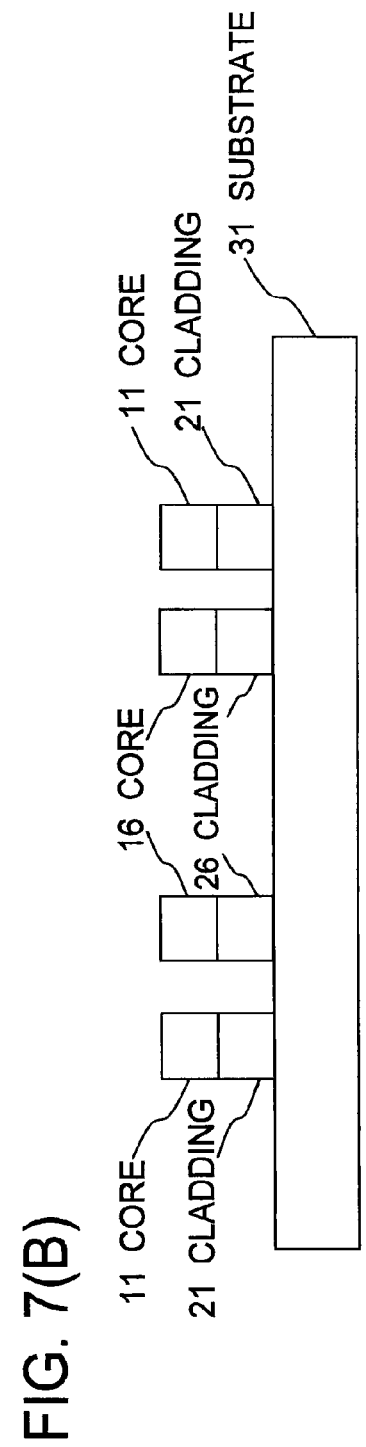

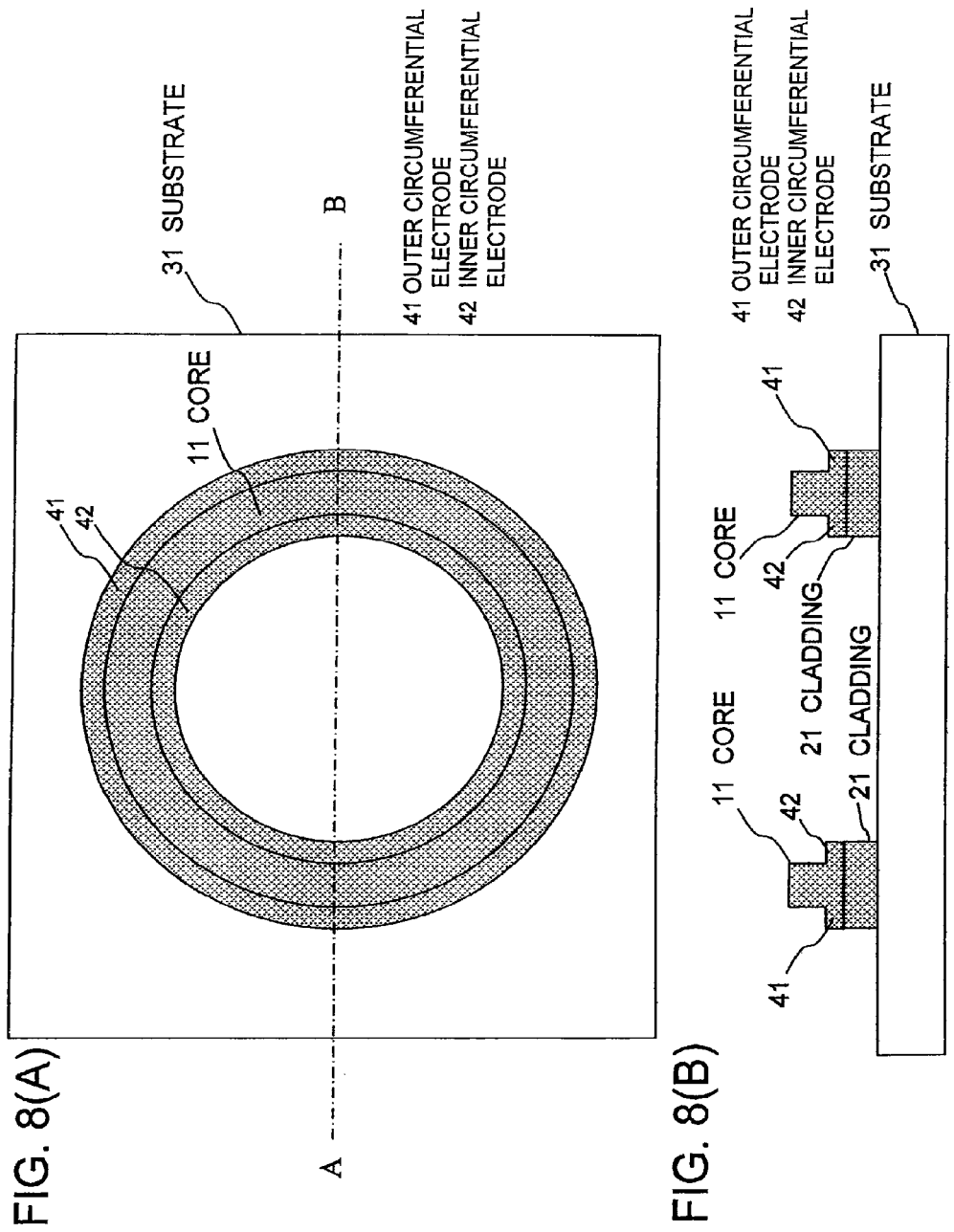

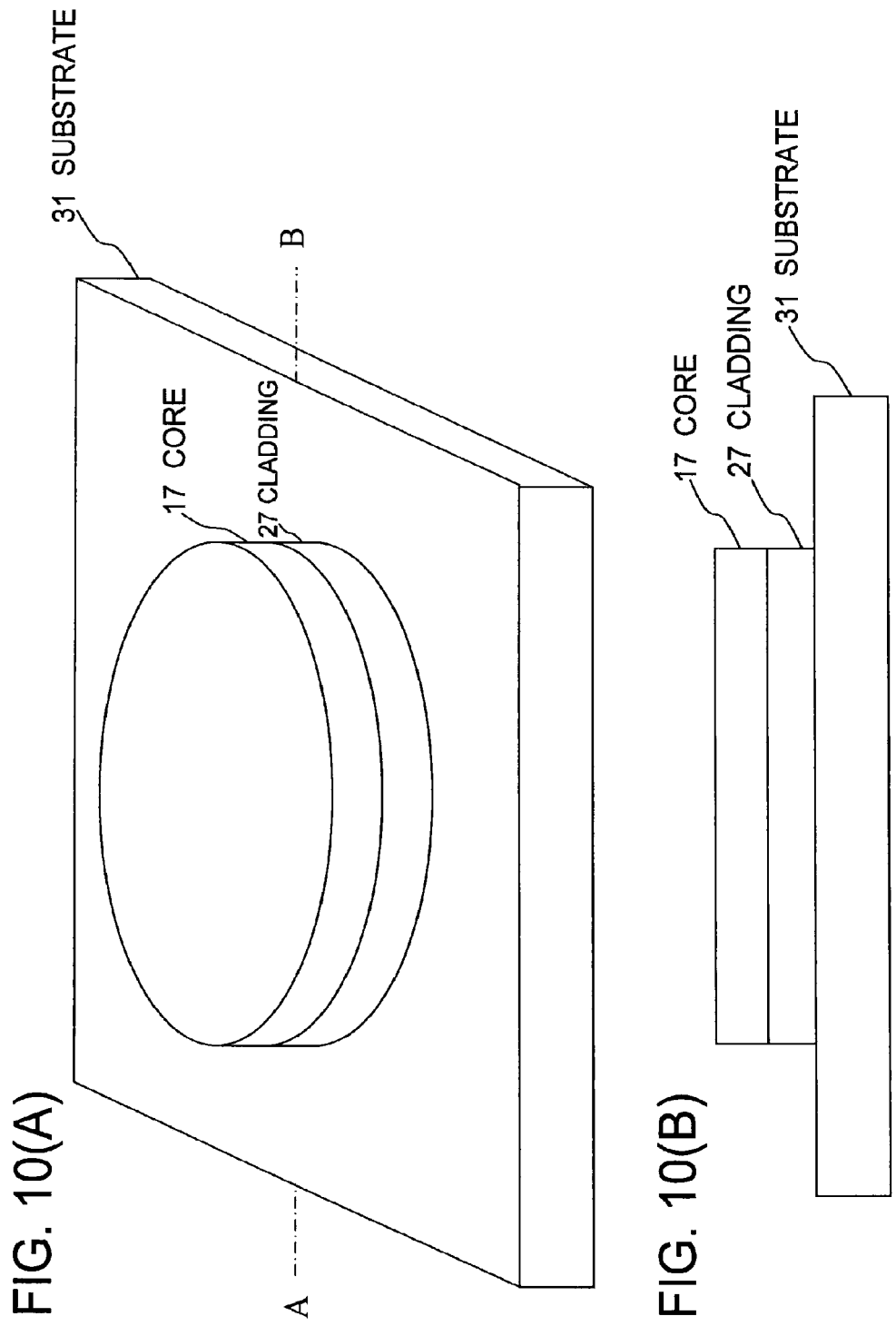

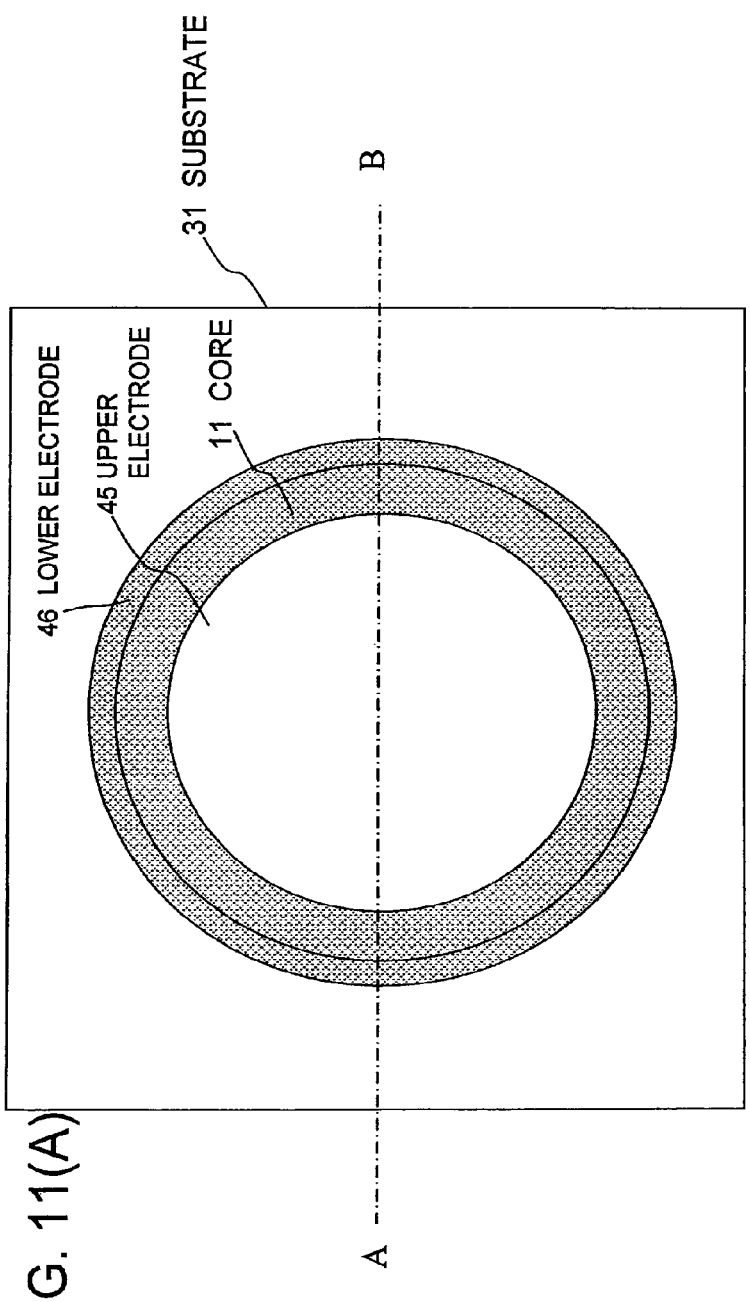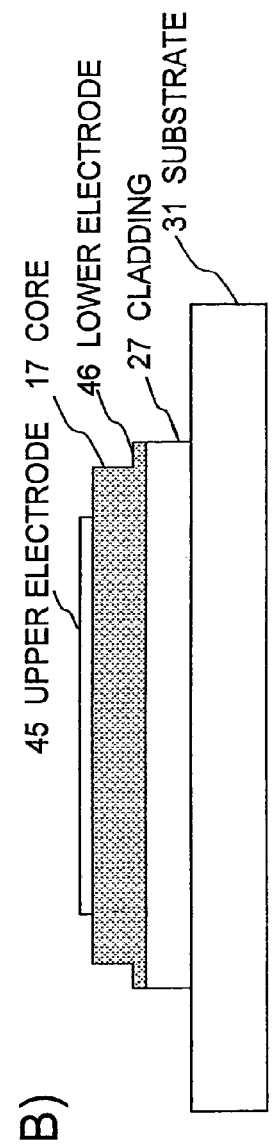

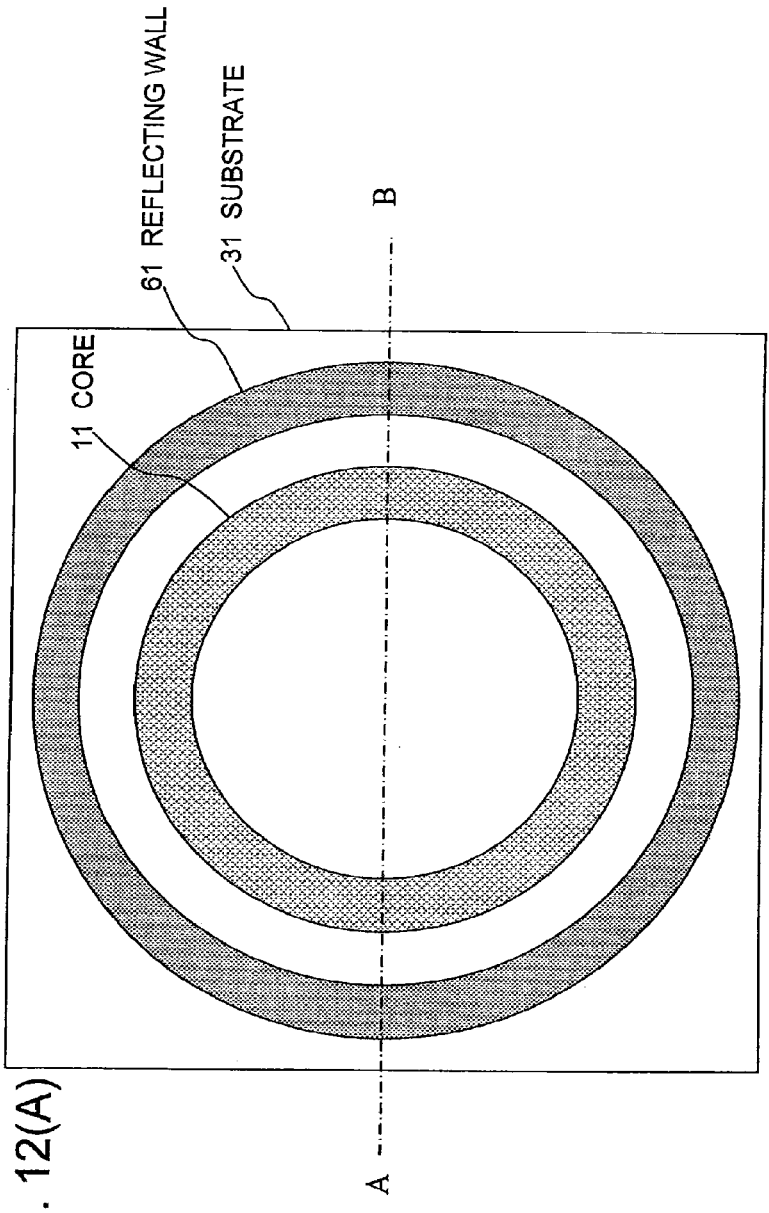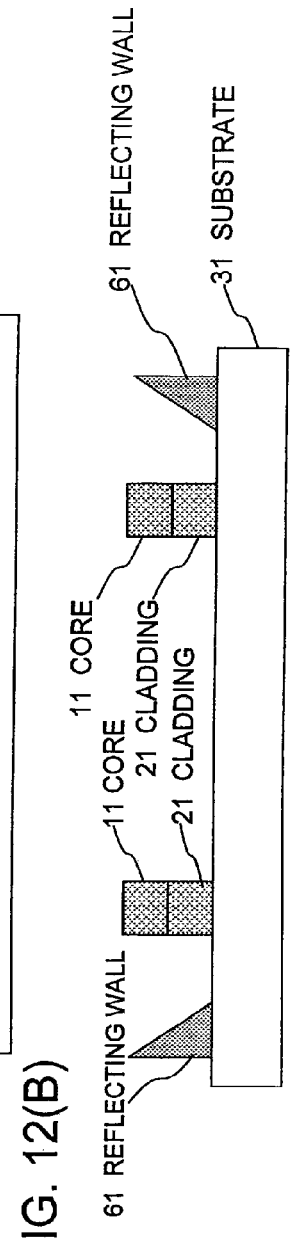
FIG. 12(A)
FIG. 12(B)

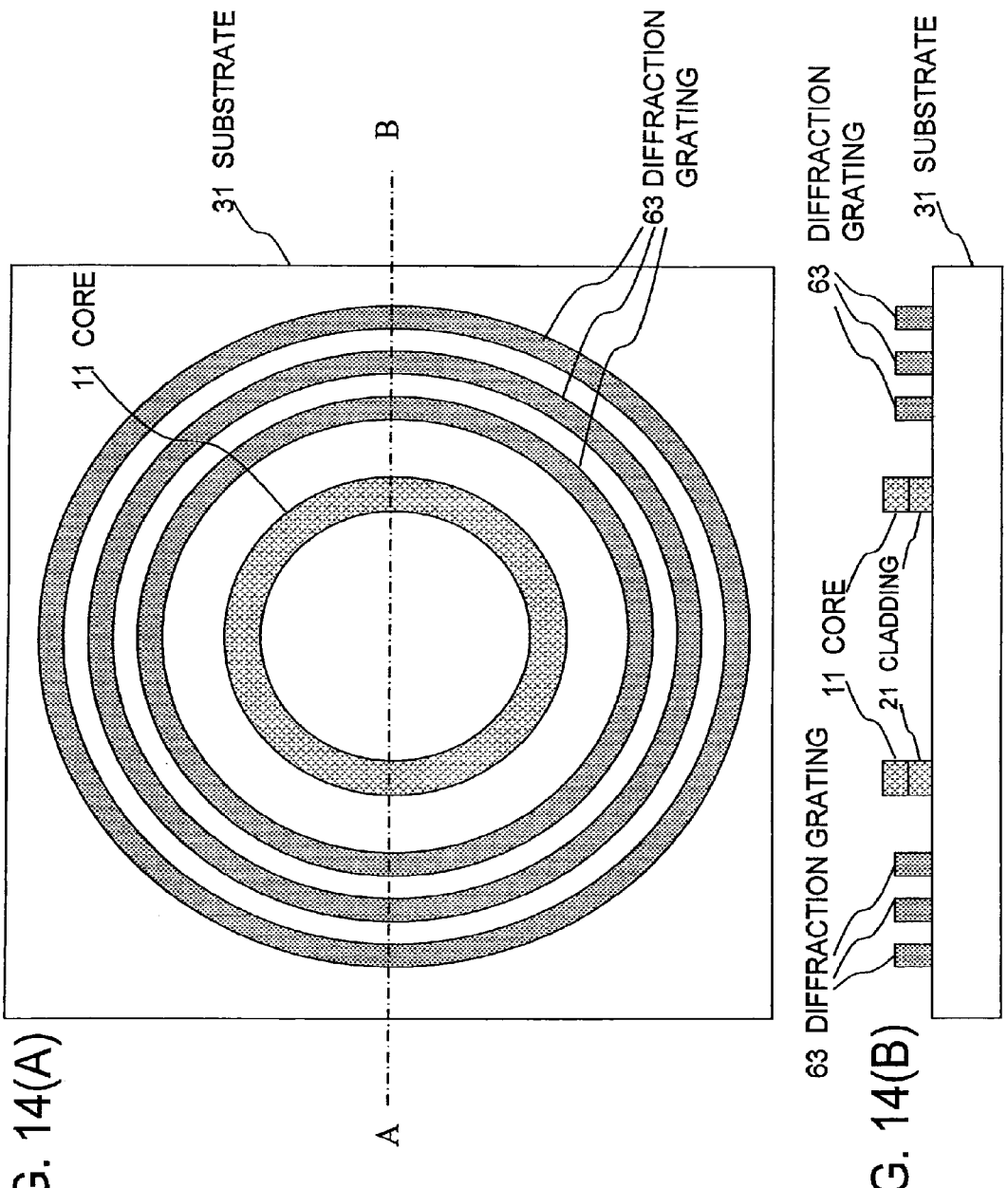

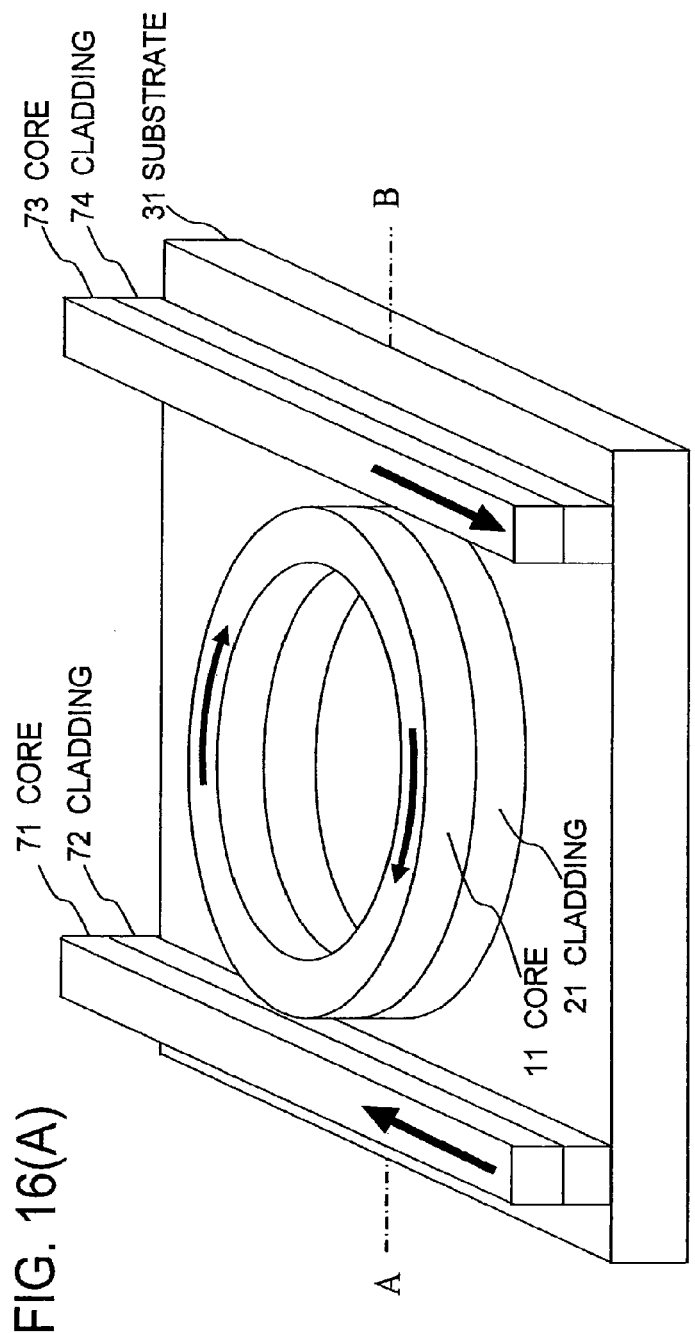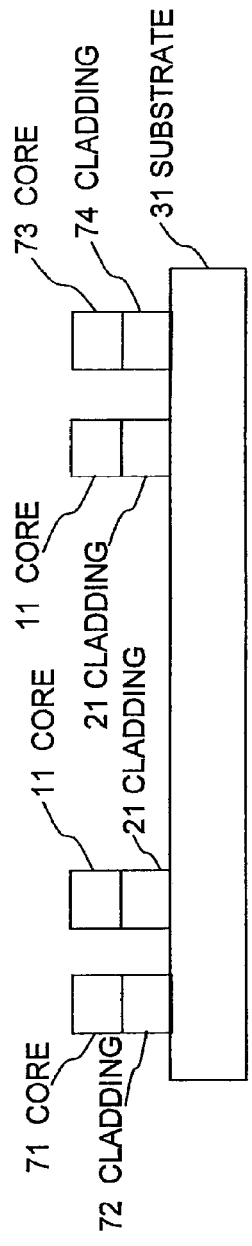

LIGHT EMITTING DEVICE

This is a U.S. national stage application of International Application No. PCT/JP2008/066845, filed on 18 Sep. 2008. Priority under 35 U.S.C. §119(a) and 35 U.S.C. §365(b) is claimed from Japanese Application No. JP2007-241408, filed 18 Sep. 2007, the disclosure of which is also incorporated herein by reference.

TECHNICAL FIELD

The present invention relates to a light emitting device that emits light by utilizing a ring optical resonator. Particularly the invention relates to a laser light emitting device in which a semiconductor technology is utilized.

BACKGROUND ART

In a recent semiconductor integrated circuit, much higher-speed signal processing is required, and a laser light emitting device is being used to transmit the signal between circuits. Particularly in a semiconductor integrated circuit, there is a strong demand for implementing a Si or Ge laser light emitting device that can be formed on a Si or Ge based semiconductor substrate. Therefore, there has been made a proposal in which a Si nanocrystal is used (see Patent Document 1) or a proposal in which the light is emitted by utilizing a Si waveguide on the Si substrate.

However, in each proposal, only spontaneous light emission from the Si crystal can be confirmed, and the laser oscillation is not achieved yet by utilizing the Si crystal.

Patent Document 1: Japanese Patent Application Laid-Open No. 2001-040348

SUMMARY OF INVENTION

Technical Problem

In view of the foregoing, an object of the invention is to study an emission mechanism in a light emitting device equipped with a ring optical resonator, propose a new structure, and implement a light emitting device that can generate a laser oscillation.

Solution to Problem

In order to achieve the object, the inventors prepares the ring optical resonator in which Si is used in the core of the waveguide and they confirmed the laser oscillation for the first time. The structure can be extended to not only the ring or disk-shaped optical resonator in which Si is used in the core waveguide but also the ring or disk-shaped optical resonator in which the semiconductor is used in the core waveguide. The present invention proposes the structure of the light emitting device that can generate the laser oscillation.

In accordance with a first aspect of the invention, a light emitting device includes a ring optical resonator laminated on a substrate, and the light emitting device is characterized in that the optical resonator includes: a core that is made of a semiconductor through which light propagates; and a cladding that is laminated on at least the substrate side in the substrate side of a lamination direction with respect to the core and a side opposite the substrate side, at least a ring inner circumference side and a ring outer circumference side of the core are covered with a space or a transparent body whose refractive index is lower than that of the cladding, and a ring inner circumference side and a ring outer circumference side of the cladding are partially covered with the space or the transparent body whose refractive index is lower than that of the cladding.

Accordingly, a ratio, in which the laser beam emitted from the semiconductor core of the ring optical resonator is converted into the radiation mode and released from the core or cladding, can be reduced.

In the light emitting device according to the first aspect, a thickness of the cladding in a lamination direction of a portion that is in contact with the spaces of the ring inner circumference side and ring outer circumference side or the transparent body is a thickness in which electric field intensity of an evanescent wave from the core becomes equal to or lower than 1/e (e is natural logarithm) of electric field intensity at a boundary surface between the core and the cladding.

When the thickness of the cladding in the portion that is in contact with the spaces of the ring inner circumference side and ring outer circumference side or the transparent body becomes equal to or lower than 1/e of the electric field intensity of the evanescent wave, a ratio in which the evanescent wave leaking out from the core to the cladding is converted into the radiation mode can sufficiently be reduced.

In the light emitting device according to the first aspect, in the cladding in a direction parallel to the substrate surface, a width on the core side is narrower than a width on a side opposite from the core.

The leakage of the evanescent wave from the core to the cladding can be reduced, and a loss caused by the conversion of the evanescent wave into the radiation mode can be reduced.

In accordance with a second aspect of the invention, a light emitting device including a ring optical resonator laminated on a substrate, and the light emitting device is characterized in that the optical resonator includes: a core that is made of a semiconductor through which light propagates; and a cladding that is laminated on at least the substrate side in the substrate side of a lamination direction with respect to the core and a side opposite the substrate side, at least a ring inner circumference side and a ring outer circumference side of the core are covered with a space or a transparent body whose refractive index is lower than that of the cladding, and, in a direction parallel to the substrate, a width of the core on the side opposite from the substrate is wider than a width on the side of the substrate.

Accordingly, because the light propagating in the core is biased to a position distant from the cladding, the leakage of the evanescent wave to the cladding can be reduced.

In the light emitting device according to the first and second aspects, the core partially includes a singular point having an effective refractive index.

The core includes the singular point having the effective refractive index, whereby the phases of the light are aligned to obtain the coherent light emission.

In accordance with a third aspect of the invention, a light emitting device includes a ring optical resonator laminated on a substrate, and the light emitting device is characterized in that the optical resonator includes: a core that is made of a semiconductor through which light propagates; and a cladding that is laminated on at least the substrate side in the substrate side of a lamination direction with respect to the core and a side opposite the substrate side, at least a ring inner circumference side and a ring outer circumference side of the core are covered with a space or a transparent body whose refractive index is lower than that of the cladding, and the core partially includes a singular point having an effective refractive index.

Accordingly, a ratio, in which the laser beam emitted from the semiconductor core of the ring optical resonator is converted into the radiation mode and released from the core, can be reduced. Additionally, the core includes the singular point having the effective refractive index, whereby the phases of the light are aligned to obtain the coherent light emission.

In the light emitting device according to the first to third aspects, the singular point having the effective refractive index is a groove formed in a ring inner circumferential surface of the core.

The groove can easily be formed, and the phases of the light are aligned by the groove to obtain the coherent light emission.

In the light emitting device according to the first to third aspects, the singular point having the effective refractive index is a projection formed in a ring inner circumferential surface of the core.

The projection can easily be formed, and the phases of the light are aligned by the projection to obtain the coherent light emission.

In the light emitting device according to the first to third aspects, the optical resonator is a ring multiple optical resonator having a nested structure.

The oscillation is generated at a common resonant frequency in the plural rings, so that the longitudinal mode of the emitted light can be reduced.

The light emitting device according to the first to third aspects includes electrodes that supply charges onto the claddings in a ring inner circumferential portion and a ring outer circumferential portion of the core, respectively.

The charges can efficiently be injected in the core.

The light emitting device according to the first to third aspects includes plural electrodes that supply charges onto the claddings in ring inner circumferential portion of the core.

The longitudinal mode of the emitted light can be reduced by localizing the injection of the charges in the core.

In accordance with a fourth aspect of the invention, a light emitting device includes a disk-shaped optical resonator laminated on a substrate, and the light emitting device is characterized in that the optical resonator includes: a core that is made of a semiconductor through which light propagates; and a cladding that is laminated on at least the substrate side in the substrate side of a lamination direction with respect to the core and a side opposite the substrate side, at least a disk outer circumference side of the core is covered with a space or a transparent body whose refractive index is lower than that of the cladding, and a disk outer circumferential side of the cladding is partially covered with the space or the transparent body whose refractive index is lower than that of the cladding.

Accordingly, a ratio, in which the laser beam emitted from the semiconductor core of the disk-shaped optical resonator is converted into the radiation mode and released from the core, can be reduced.

The light emitting device according to the fourth aspect includes electrodes that supply charges onto a surface of the core on the side opposite from the substrate and the cladding in the disk outer circumferential portion of the core, respectively.

The charges can efficiently be injected in the core.

The light emitting device according to the first to fourth aspects includes a reflecting wall surrounding the optical resonator on the substrate, the reflecting wall reflecting outgoing light, radiated from the optical resonator, in an upper surface direction of the substrate.

The outgoing light radiated from the optical resonator can be reflected in the upper surface direction of the substrate by the reflecting wall.

In the light emitting device according to the fourth aspect, the reflecting wall is divided into plural pieces, and the reflecting wall has a reflecting surface, such that the outgoing light radiated in a direction of a tangent to a ring outer circumferential circle of the core is incident to the divided reflecting wall at an angle of 45 degrees, and such that the outgoing light incident to the divided reflecting wall is reflected from the reflecting surface in a direction at a right angle to an upper surface of the substrate.

The outgoing light radiated from the optical resonator can be reflected in the direction at a right angle to the upper surface of the substrate by the reflecting wall.

The light emitting device according to the first to fourth aspects includes a diffraction grating surrounding the optical resonator on the substrate, the diffraction grating diffracting outgoing light radiated from the optical resonator toward an upper surface direction of the substrate.

The outgoing light radiated from the optical resonator can be diffracted in the upper surface direction of the substrate by the diffraction grating.

In the light emitting device according to the fourth aspect, the diffraction grating is divided into plural pieces, and the diffraction grating has a grating disposition, such that the outgoing light radiated in a direction of a tangent to a ring outer circumferential circle of the core is incident to a grating of the divided diffraction grating at a right angle, and such that the outgoing light incident to the divided diffraction grating is diffracted in a direction at a right angle to an upper surface of the substrate.

The outgoing light radiated from the optical resonator can be diffracted in the direction at a right angle to an upper surface of the substrate by the diffraction grating.

The light emitting device according to the first to fourth aspects includes an input waveguide that performs evanescent wave coupling with the optical resonator to couple input light with the optical resonator.

The input light can be fed into the optical resonator in a planar optical circuit.

The light emitting device according to the first to fourth aspects includes an output waveguide that performs the evanescent wave coupling with the optical resonator to couple the outgoing light radiated from the optical resonator.

The output light can be supplied from the optical resonator in the planar optical circuit.

In the light emitting device according to the first to fourth aspects, the core is made of a semiconductor that mainly contains Si, Ge, or a mixed crystal of Si and Ge.

The good consistency with the existing semiconductor technology is obtained, and the existing semiconductor process can be utilized.

In accordance with a fifth aspect of the invention, a semiconductor integrated circuit including the light emitting device and a semiconductor circuit on a substrate.

Accordingly, the light emitting device and the semiconductor circuit can be formed on the same substrate.

Advantageous Effects of Invention

In the light emitting device of the invention, the laser oscillation can easily be generated by the optical resonator in which the semiconductor is used in the core.

BRIEF DESCRIPTION OF DRAWINGS

FIG. 1(A) is a perspective view of a light emitting device according to an embodiment of the invention, and FIG. 1(B) is a sectional view of the light emitting device of the embodiment.

FIG. 3(A) is a perspective view of a light emitting device according to an embodiment of the invention, and FIG. 3(B) is a sectional view of the light emitting device of the embodiment.

FIG. 4(A) is a perspective view of a light emitting device according to an embodiment of the invention, and FIG. 4(B) is a sectional view of the light emitting device of the embodiment.

FIG. 5(A) is a perspective view of a light emitting device according to an embodiment of the invention, and FIG. 5(B) is a sectional view of the light emitting device of the embodiment.

FIG. 6(A) is a perspective view of a light emitting device according to an embodiment of the invention, and FIG. 6(B) is a sectional view of the light emitting device of the embodiment.

FIG. 7(A) is a perspective view of a light emitting device according to an embodiment of the invention, and FIG. 7(B) is a sectional view of the light emitting device of the embodiment.

FIG. 8(A) is a plan view of a light emitting device according to an embodiment of the invention, and FIG. 8(B) is a sectional view of the light emitting device of the embodiment.

FIG. 10(A) is a perspective view of a light emitting device according to an embodiment of the invention, and FIG. 10(B) is a sectional view of the light emitting device of the embodiment.

FIG. 11(A) is a plan view of a light emitting device according to an embodiment of the invention, and FIG. 11(B) is a sectional view of the light emitting device of the embodiment.

FIG. 12(A) is a plan view of a light emitting device according to an embodiment of the invention, and FIG. 12(B) is a sectional view of the light emitting device of the embodiment.

FIG. 14(A) is a plan view of a light emitting device according to an embodiment of the invention, and FIG. 14(B) is a sectional view of the light emitting device of the embodiment.

FIG. 16(A) is a perspective view of a light emitting device according to an embodiment of the invention, and FIG. 16(B) is a sectional view of the light emitting device of the embodiment.

Figure 2:
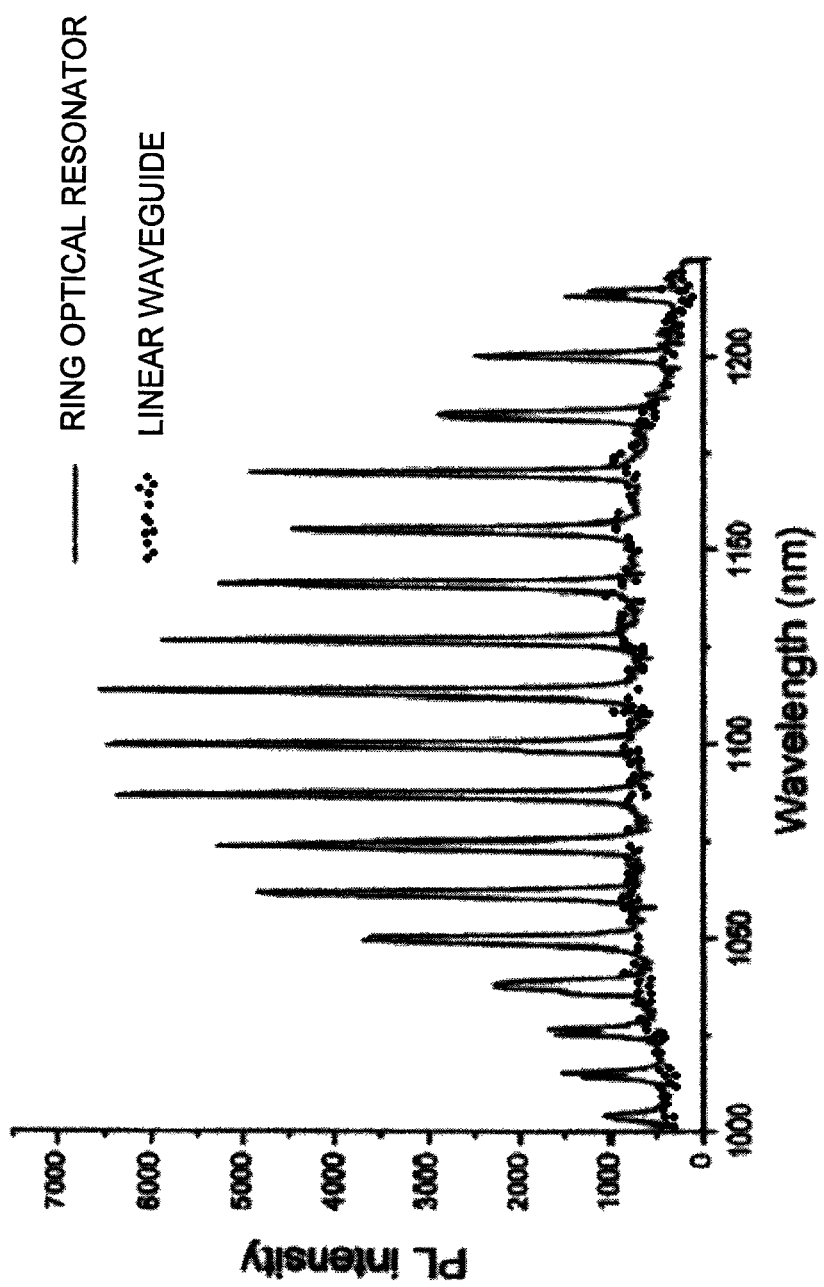
FIG. 2 is a spectral example of a light emitting device according to an embodiment of the invention.

REFERENCE SIGNS LIST 11, 13, 14, 15, 16, and 17: core
21, 22, 23, 26, and 27: cladding
31 and 32: substrate
51: vertical groove
52: vertical projection
41: outer circumferential electrode
42: inner circumferential electrode
43: first electrode
44: second electrode
45: upper electrode
46: lower electrode
61 and 62: reflecting wall
63 and 64: diffraction grating
71 and 73: core
72 and 74: cladding

DESCRIPTION OF EMBODIMENTS

Embodiments of the invention will be described below. However, the invention is not limited to the following descriptions.

First Embodiment

A light emitting device according to a first embodiment of the invention includes a ring optical resonator laminated on a substrate, and the light emitting device of the first embodiment is characterized in that the optical resonator includes: a core that is made of a semiconductor through which light propagates; and a cladding that is laminated on at least the substrate side in the substrate side of a lamination direction with respect to the core and a side opposite the substrate side, at least a ring inner circumference side and a ring outer circumference side of the core are covered with a space or a transparent body whose refractive index is lower than that of the cladding, and a ring inner circumference side and a ring outer circumference side of the cladding are partially covered with the space or the transparent body whose refractive index is lower than that of the cladding.

FIG. 1(A) is a perspective view of a light emitting device of the first embodiment, and FIG. 1(B) is a sectional view taken on a line A-B of FIG. 1(A). The numeral 31 designates a substrate, the numeral 11 designates a ring core that is made of semiconductor through which the light propagates, and the numeral 21 designates a ring cladding that is laminated so as to come into contact with a substrate side of the core 11 in a lamination direction. In the core 11, there are spaces on a ring inner circumference side, a ring outer circumference side, and an upper surface on the side opposite from the cladding 21. A cladding whose refractive index is lower than that of the core 11 may be laminated on the upper surface of the core 11. The cladding 21 has the refractive index lower than that of the core 11, and has a function of confining the light propagating in the core 11. In FIG. 1, the cladding 21 is laminated so as to come into contact with the core 11. Alternatively, another layer such as a super lattice layer may be laminated between the cladding 21 and the core 11 as long as the cladding 21 exerts the function of confining the light propagating in the core. The holes and electrons, injected in the core 11, are coupled in the core made of semiconductor, thereby emitting the light. Because the core 11 is surrounded by the space or the cladding 21, the emitted light propagates in the core 11. The same holds true for the case in which the cladding whose refractive index is lower than that of the core 11 is laminated in the upper surface of the core 11 on the side opposite from the cladding 21. In the cladding 21, the spaces may wholly be formed on the ring inner circumference side and the ring outer circumference side as illustrated in FIG. 1, or the spaces may partially be formed on the ring inner circumference side and the ring outer circumference side. That is, the cladding layer laminated on the substrate 31 may wholly be removed except a lower portion of the core 11, or the cladding layer may be prepared while only an upper portion of the cladding layer is removed. The upper surface, ring outer circumference side, and ring inner circumference side of the core 11 and the ring outer circumference side and ring inner circumference side of the cladding 21 may be covered with a transparent body whose refractive index is lower than that of the cladding 21.

A semiconductor mainly made of Si, Ge, or a mixed crystal of Si and Ge can be cited as an example of the material for the core 11. It is necessary that a material that can be laminated in the upper surface of the cladding 21 or core 11 have the refractive index of the material for the core 11. For the core 11 made of Si, for example, $SiO_2$, $Si_3N_4$, SiON, and SiC can be cited as the material for the cladding 21. For the core 11 made of Ge, for example, SiGe, Si, $SiO_2$, $Si_3N_4$, SiON, and SiC can be cited as the material for the cladding 21. For the core 11 made of the mixed crystal of Si and Ge, for example, SiGe having a Ge ratio lower than that of SiGe of the core 11, Si, $SiO_2$, $Si_3N_4$, SiON, and SiC can be cited as the material for the cladding 21. It is necessary that a material for the transparent body have the refractive index of the material for the cladding 21. For the cladding 21 made of Si, for example, $SiO_2$ can be cited as the material for the transparent body. The transparent body made of $SiO_2$ may be a passivation film that suppresses surface recoupling of Si. The same holds true for the core and cladding of the optical resonator and the material for the transparent body in the following embodiments.

For example, Si, SiGe, Ge, $SiO_2$, $Si_3N_4$, SiON, and SiC can be cited as the material for the substrate 31. A semiconductor may be used as the material for the substrate 31, or an insulating material may be used as the material for the substrate 31. Alternatively, a double structure of Si and $SiO_2$, which is formed by oxidizing the surface of Si, may be used as the substrate. Alternatively, a surface of $SiO_2$ is removed while part of $SiO_2$ constituting the lower portion of the core 11 remains, and the remaining $SiO_2$ may be used as the cladding 21. The material for the substrate has the consistency with the existing semiconductor technology, and a process of producing the existing semiconductor integrated circuit can be utilized. A semiconductor integrated circuit in which the light emitting device of the invention and a semiconductor circuit are formed on the same substrate is easy to prepare. For example, the semiconductor circuit means electronic circuits such as an amplifying circuit, a digital logic circuit, and a modulation-demodulation circuit. The same holds true for the material for the substrate in the light emitting device of the following embodiments.

Example

Figure 17:
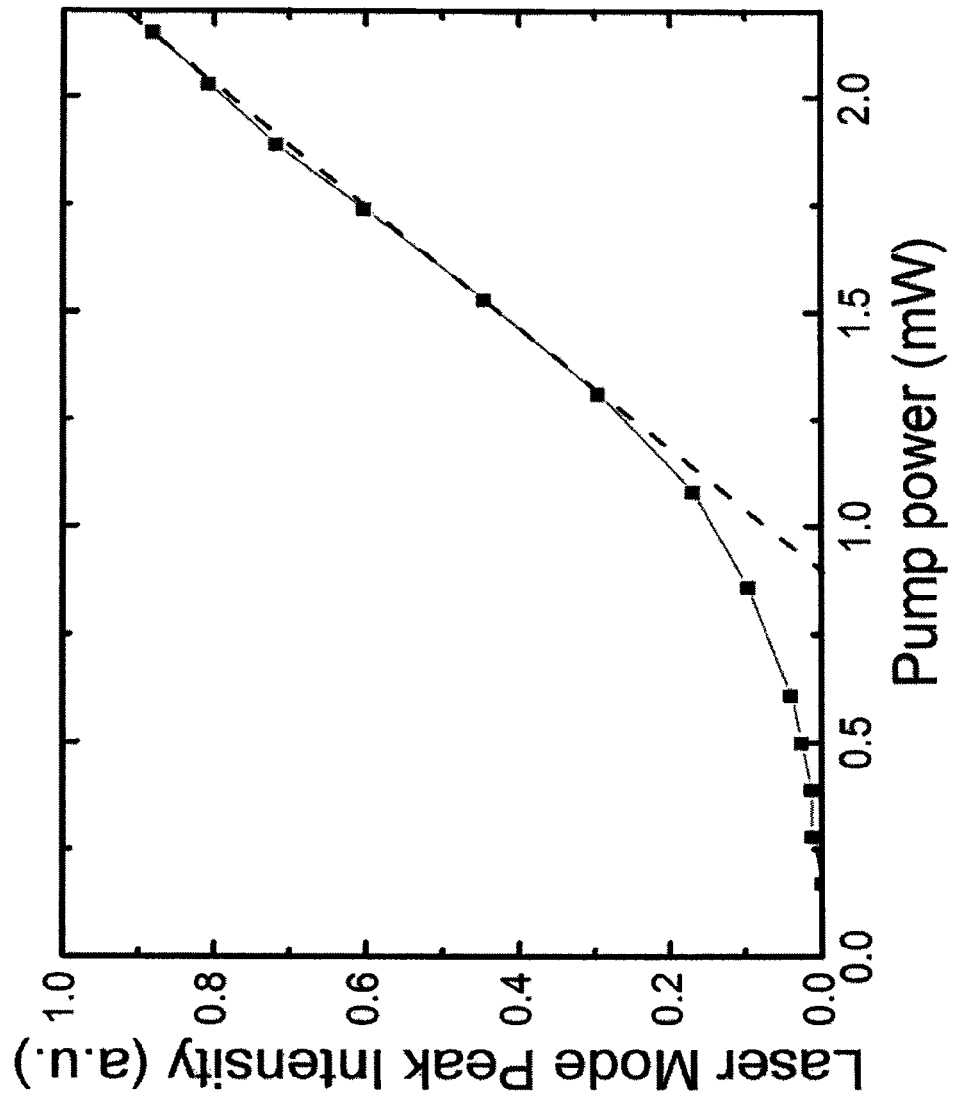
FIG. 17 illustrates an example of an input-output characteristic of a light emitting device according to an embodiment of the invention.

As illustrated in FIG. 1, a light emitting device according to an example has a structure in which a ring optical resonator is formed by the core 11 and cladding 21 on the substrate 31. The substrate 31 is made of Si, the core 11 is made of Si, and the cladding 21 is made of $SiO_2$. The spaces are formed on the ring outer circumference sides and ring inner circumference sides of the core 11 and cladding 21 and the upper surface of the core 11. The ring has a radius of 300 nm, the core has a width of 300 nm, and the core has a thickness of 340 nm. The light emitting device of the example has this structure and the electrode structure in which the electrons and holes are externally injected. In FIG. 1, an electrode structure is omitted. FIG. 2 illustrates result in which, in order to explain a basic operation, charges are locally injected in the ring optical resonator to measure dependence of emission intensity on a wavelength. In FIG. 2, an upper side expresses the ring optical resonator, and a lower side expresses an emission spectrum in the linear waveguide. In the ring optical resonator, many steep peaks are generated in the emission spectrum. The peaks indicate the laser oscillation is generated by a Purcell effect. In the Purcell effect, the light propagating in the ring makes a standing-wave state, and emission intensity is increased by a wavelength in the standing-wave state. FIG. 17 illustrates measurement result of an input-output characteristic in which an argon laser beam is injected as excitation light in the light emitting device. In FIG. 17, when a level of the excitation light is increased to reach a threshold, the emission intensity is rapidly increased, and then the emission intensity is linearly increased. The results illustrates that the Purcell effect, in which the emission intensity is increased from the neighborhood of the threshold, is generated to perform the laser oscillation.

Assuming that r is a ring radius and $n_{eff}$ is an effective refractive index of the ring optical resonator, a light emission wavelength λ, can be expressed by an equation (1):

$$\lambda = (2\pi r/m) \cdot n_{eff} \quad (1)$$

where m is a longitudinal mode order of a propagation mode. At this point, assuming that Q is a resonant Q value of the ring optical resonator and V is a volume, because an enhancing factor F of the Purcell effect is proportional to Q/V, the high Q value and the micro volume V are required for the enhancement.

Although a general principle of the light enhancement is well known, the inventors experimentally establish the laser oscillation by proposing a ring optical resonator having a new structure in which Si is used as the core. Height emission process is as follows. When the electrons and holes are continuously injected in the Si core, in the light emitted by the recoupling of the charges, the light having a wavelength satisfying the equation (1) propagates as a standing wave in the core of the ring optical resonator. At this point, in the core having an infinite Q value, the electric field intensity of the light is increased with time. The electric field intensity of the light in the standing-wave state exists as an evanescent wave even in a space outside the core, and is exponentially reduced according to a distance from the core. Therefore, the electric field intensity of the evanescent wave is increased with increasing electric field intensity of the light accumulated in the core. As a result of the coupling of part of the evanescent wave in a radiation mode, the light is emitted from the core to the space. This is called a light guiding bending loss. The steady state is established when the intensity of the light that is emitted from the core to the space as the light guiding bending loss is balanced with the emission intensity of the recoupling of the electrons and holes injected in the core. Actually the ring optical resonator has a finite Q value because attenuation is generated through dissipation processes such as scattering and absorption in the core. Therefore, the intensity of the light radiated from the core always becomes lower than the emission intensity of the recoupling of the electrons and holes. Although integral intensity of the light emission becomes identical for the identical dissipation process, peak intensity of the light emission is increased with increasing Q value of the resonator.

The process in which the energy is dissipated from the core mainly includes the following factors:

A. non-light emission recoupling process in which the injected charges are recoupled to dissipate without the light emission, B. light absorption by the core material in which the light is emitted by the recoupling of the injected charges C. spontaneous light emission dissipating from the upper surface or lower surface of the core, D. scattering of the light propagating in the core due to roughness of the core surface, E. evanescent wave radiation leaking out to the cladding from the upper surface or lower surface of the core, and F. light guiding bending loss A structure of the ring optical resonator that minimizes the factors will be described below. At this point, it is noted that the ring optical resonator does not have a function of aligning phases of light emission unlike a standing-wave type resonator because the ring optical resonator is a travelling-wave type resonator. Therefore, intrinsically the light emission is incoherent. In order that the light emission is coherent, a singular point is effectively introduced in the structure as described later. For the sake of convenience, the charges are injected in part of the core to align the phases of light, thereby minimizing the dissipation process.

The factor promoting A. non-light emission recoupling process is defects existing in the core and the core surface. For example, the defect is introduced to Si that is of the core material by dry etching and the like in forming the ring optical resonator. The surface defect acts as a recoupling defect because the surface defect has an un-coupled hand. In order to prevent the defects, a high-temperature heat treatment is performed, or an oxide film is effectively formed against the surface defect after the ring optical resonator is formed. The surface is thinly etched by piranha cleaning in which Si is cleaned by a mixing solution of sulfuric acid and hydrogen peroxide water, and the oxide film is removed by hydrofluoric acid to eliminate the defect layer. In addition to the defect layer, because a fluoric protective film formed in a side face during the dry etching also acts as the recoupling center, the protective film is effectively removed by the piranha cleaning and the hydrofluoric acid treatment.

As to B. light absorption, considering that the light emission is a reverse process of the light absorption, because the light emission is not generated in the material in which the light absorption is not generated, the material in which the light absorption is not completely generated cannot be used as the core. On the other hand, in order to form the optical resonator, it is assumed that the light interferes with the light going around the ring. Accordingly, the wavelength having an absorption coefficient that is too high to go around the ring does not become the target. In other words, the wavelength that can be enhanced by the Purcell effect depends on the material. The absorption coefficient of Si becomes 4.0e-4/cm, 3.1e-5/cm, and 1.2e-6/cm when the wavelength is 1.0, 1.1, and 1.2 μm. The intensity becomes 1/e when the distance is 10 m or more. Accordingly, it is found that Si is transparent to the light having the wavelength of 1.1 μm or more such that the standing wave is sufficiently generated in the core having a circumferential length of about 15 μm. On the other hand, on the long wavelength side, the absorption coefficient is low, and emission intensity becomes weak, a peak exists at the wavelength of about 1.1 μm. For this reason, the maximum peak exists at the wavelength of 1.1 μm in the sharp spectral peak group of FIG. 2.

The SiGe mixed crystal in which Ge is mixed into Si is always an indirect transition semiconductor, the absorption coefficient close to a band end is small as Si. However, in a forbidden band, the wavelength is lengthened from 1.1 μm to 1.8 μm according to a Ge composition of the mixed crystal. Accordingly, the light emitting device having the wavelength of 1.1 μm to 1.8 μm can be implemented by utilizing a specific composition.

C. spontaneous light emission dissipating from the upper surface or lower surface of the core 11 cannot be prevented in principle. When Si is used in the core 11, because of the high refractive index, internal total reflection is efficiently generated. Therefore, in the light dissipating from the upper surface constituting the space of the core 11, only the light entering a circular cone having a predetermined angle becomes the loss. In the light dissipating from the lower surface that is in contact with the cladding 21, only the light having the angle larger than the predetermined angle becomes the loss. When the cladding is also laminated in the upper surface of the core 11, the predetermined angle is increased. Because the standing wave is not formed in the spontaneous light emission component, the spontaneous light emission component is a wavelength component having a continuous spectrum similar to that of the linear waveguide of FIG. 2.

As to D. irregularity generating the light scattering, the upper surface and lower surface of the core has flatness higher than that of the side face. Therefore, a structure that reduces the side-face irregularity generated in forming the ring optical resonator is adopted in the invention. Although specifically described later in the producing method, the wet etching method can be applied. It is estimated that the irregularity of about 2 nm is generated from a minimum pattern size used in electron beam exposure. It is found that the emission peak intensity is increased as the number of treatment times is increased.

E. evanescent wave radiation is the dissipation that is generated by coupling the evanescent wave component leaking out to the cladding from the upper surface or lower surface of the core with the radiation mode due to the light guiding bending. Particularly, in FIG. 1, assuming that the core 11 is made of Si and the cladding 21 is made of $SiO_2$, a refractive index difference between the Si core and the $SiO_2$ cladding is smaller than that of the space of the upper surface and Si. Therefore, in order that the evanescent wave component leaking out to the cladding 21 of the lower surface is not coupled with the radiation mode, the cladding 21 is processed along the side face of the ring optical resonator up to an evanescent wave reaching depth, and the space is partially formed on the ring inner circumference side and ring outer circumference side of the cladding. Desirably the thickness in the lamination direction of the portion that is in contact with the spaces of the cladding 21 on the ring inner circumference side and ring outer circumference side is the thickness in which the electric field intensity of an evanescent wave from the core 11 becomes equal to or lower than 1/e of the electric field intensity at a boundary surface between the core 11 and the cladding 21. When the ring inner circumference side and ring outer circumference side of the cladding 21 are surrounded by the spaces up to the thickness of 1/e or more, advantageously the coupling of the evanescent wave component with the radiation mode is reduced.

F. bending loss is a function of the refractive index difference between the core and the space on the outer circumferential side of the core or the transparent body, and F. bending loss can be prevented by increasing the ring radius.

Thus, the light emitting device including the ring optical resonator of the Si core and the $SiO_2$ cladding is described in the example. When the light emitting device is formed on $SiO_2$, the same holds true for the light emitting device including the ring optical resonator in which the semiconductor, such as SiGe and Ge, which emits the light at another wavelength, is used.

The case in which the cladding 21 is made of Si will be described. Unlike the $SiO_2$ cladding, the Si cladding cannot be used in the ring optical resonator in which the core is made of Si. However, the Si cladding can be used in the SiGe or Ge ring optical resonator. In other words, instead of Si, the SiGe mixed crystal whose refractive index is lower than that of the core material can be used as the cladding. One of the features of the cladding is that current can be passed because of the semiconductor to facilitate the formation of the electrode.

Second Embodiment

A light emitting device according to a second embodiment of the invention includes a ring optical resonator in which the Ge core and the Si cladding are combined. Because of the small refractive index difference between the Ge core and the Si cladding, the loss is increased by C. the dissipation of the spontaneous emission light from the core. The evanescent wave radiation from the core to the cladding is also increased. The loss due to E. evanescent wave radiation is reduced by over etching of the cladding. FIG. 3(A) is a perspective view of the light emitting device having the structure of the second embodiment, and FIG. 3(B) is a sectional view taken on a line A-B of FIG. 3(A). In the direction parallel to a substrate surface of a cladding 22, a width on the side of the core 11 is wider than a width on the side opposite from the core 11. Therefore, the leakage of the evanescent wave from the core 11 to the cladding 22 can be reduced, and the bending loss caused by the coupling of the evanescent wave with the radiation mode can be reduced because the leakage of the evanescent wave is decreased. When the T-shape cladding of FIG. 3(B) is formed, the propagation mode is stabilized. The width of the cladding 22 may gradually be reduced from the side of the core 11 toward the side opposite from the core 11. The structure can be applied to not only the combination of the Ge core and the Si cladding, but also the combination of the core material and the cladding material. The $SiO_2$ passivation film may be formed as the transparent body in the surface of the Si cladding. For the Si upper surface of the substrate 31, the $SiO_2$ passivation film may be formed on the Si upper surface.

Third Embodiment

FIG. 4(A) is a perspective view of a light emitting device according to a third embodiment of the invention, and FIG. 4(B) is a sectional view taken on a line A-B of FIG. 4(A). The ring optical resonator having the structure of FIG. 4 effectively reduces the leakage of the evanescent wave to the cladding. A cladding 23 constitutes an upper surface of a substrate 32. A ring core 13 is laminated so as to come into contact with the cladding 23. For example, a Si core 13 is laminated on the Si substrate 32 and the upper surface of the $SiO_2$ cladding 23 in which the Si upper surface is oxidized. In the direction parallel to the substrate 32, a width of the core 13 on the side opposite from the substrate 32 is wider than a width on the side of the substrate 32 by the over etching in etching the Si core 13.

As illustrated in FIG. 4, in the direction parallel to the substrate 32, when the width of the core 13 on the side opposite from the substrate 32 is wider than the width on the side of the substrate 32, the light propagating in the core 13 is biased to the position distant from the cladding 23, so that the leakage of the evanescent wave to the cladding 23 can be reduced. As a result, the leakage of the evanescent wave to the cladding 23 is reduced, so that the loss caused by the E. evanescent wave radiation can be reduced. When the T-shape cladding of FIG. 4(B) is formed, the propagation mode is stabilized. The width of the core 13 may gradually be reduced from the upper surface toward the side of the substrate 32.

In FIG. 4, the cladding 23 is not removed by the etching. Alternatively, part or the whole of cladding 23 except the lower surface of the core 13 may be removed by the etching such that the ring inner circumference side and ring outer circumference side of the cladding 23 partially become the spaces. When part or the whole of cladding 23 except the lower surface of the core 13 is removed such that the ring inner circumference side and ring outer circumference side of the cladding 23 partially become the spaces, a ratio in which the evanescent wave leaking to the cladding 23 is coupled with the radiation mode and released can be reduced. In FIG. 4, the cladding 23 is laminated so as to come into contact with the core 13. Alternatively, as long as the cladding 23 exerts the function of confining the light propagating in the core, another layer such as a super lattice layer may be laminated between the cladding 23 and the core 13.

The cladding may be laminated on the upper surface of the core 13. For the Si core 13, the $SiO_2$ passivation film may be formed as the transparent body on the surface of the Si core 13. The combination of the Si core and the $SiO_2$ cladding is described in the second embodiment. However, the second embodiment can also be applied to the combination of the core material and the cladding material.

Fourth Embodiment

In the first to third embodiments, the local current injection is utilized in order to obtain the coherent light emission in the ring optical resonator. However, the absorption coefficient is advantageously increased in order to form a charge inverted distribution to generate the laser oscillation. The structure in which the coherency can be obtained even if the current is injected in the whole surface of the core will be described below. Basically the singular point having the effective refractive index is formed at least one point in the core.

For example, a vertical groove is formed in part of a ring inner circumferential surface of the core, and the effective refractive index is decreased than other parts in the vertical groove. Therefore, the vertical groove triggers the coherent light emission. FIG. 5 illustrates an example in which a vertical groove is formed in part of the ring inner circumferential surface of the core of the optical resonator of the first embodiment. FIG. 5(A) is a perspective view of the light emitting device of the fourth embodiment, and FIG. 5(B) is a sectional view taken on a line A-B of FIG. 5(A). In FIG. 5, the numeral 31 designates the substrate, the numeral 14 designates the core made of the semiconductor through which the light propagates, and the numeral 21 designates the cladding that is laminated on the substrate side of the core 14 in the lamination direction. In the core 14, the spaces are formed on the ring inner circumference side, the ring outer circumference side, and the upper surface on the side opposite from the cladding 21. The substrate side of the core 14 is in contact with the cladding 21 whose refractive index is lower than that of the core 14. The numeral 51 designates the vertical groove that is formed in the ring inner circumferential surface of the core 14. In the vertical groove 51, the effective refractive index of the core is decreased, and the phases of the light are aligned by the singular point having the effective refractive index to obtain the coherent light emission.

On the contrary, when a projection is formed in part of the ring inner circumferential surface of the core to increase the effective refractive index of the projection, the projection triggers the coherent light emission. FIG. 6 illustrates an example in which a vertical projection is formed in part of the ring inner circumferential surface of the core of the optical resonator of the first embodiment. In FIG. 6, the numeral 31 designates the substrate, the numeral 15 designates the core made of the semiconductor through which the light propagates, and the numeral 21 designates the cladding that is laminated on the substrate side of the core 15 in the lamination direction. In the core 15, the spaces are formed on the ring inner circumference side, the ring outer circumference side, and the upper surface on the side opposite from the cladding 21. The substrate side of the core 15 is in contact with the cladding 21 whose refractive index is lower than that of the core 15. The numeral 52 designates the vertical projection that is formed in the ring inner circumferential surface of the core 14. In the vertical projection 52, the effective refractive index of the core is increased, and the phases of the light are aligned by the singular point having the effective refractive index to obtain the coherent light emission.

In FIGS. 5 and 6, the cladding layer surrounding the core 14 or 15 is removed such that the cladding 21 exists only below the core. However, even if the cladding layer is wholly left, the coherent light emission is obtained by the singular point having the effective refractive index.

In the fourth embodiment, the ring inner circumferential surface of the core is processed so as to become the singular point having the effective refractive index. Alternatively, the ring outer circumferential surface of the core may be processed so as to become the singular point having the effective refractive index.

For the second and third embodiments, the singular point having the effective refractive index is also effectively processed in order to obtain the coherent light emission.

Only an even-numbered mode is excited when the singular points having the effective refractive indices are formed at even-numbered points, and only an odd-numbered mode is excited when the singular points having the effective refractive indices are formed at odd-numbered points. Therefore, the number of modes is decreased to improve the contribution of the charges to the light emission. When the disposition and the number of singular points having the effective refractive indices are designed by the precise computation, only one longitudinal mode can be generated in the ring optical resonator.

Fifth Embodiment

The ring multiple optical resonator having the nested structure effectively reduces the longitudinal mode generated in the ring optical resonator. FIG. 7 illustrates an example of the light emitting device including the ring multiple optical resonator having the nested structure. FIG. 7(A) is a perspective view of the light emitting device including the ring double optical resonator of the fifth embodiment, and FIG. 7(B) is a sectional view taken on a line A-B of FIG. 7(A). In FIG. 7, the outside optical resonator of the ring double optical resonator includes the core 11 made of the semiconductor through which the light propagates and the cladding 21 that is laminated on at least the side of the substrate 31 in the side of the substrate 31 of the core 11 in the lamination direction and the side opposite from the substrate 31, and the inside optical resonator of the double optical resonator includes a core 16 made of the semiconductor through which the light propagates and a cladding 26 that is laminated on at least the side of the substrate 31 in the side of the substrate 31 of the core 16 in the lamination direction and the side opposite from the substrate 31. In the cores 11 and 16, the spaces are formed on the ring inner circumference side and the ring outer circumference side. In the cladding 21 and 26, the spaces are wholly formed on the ring inner circumference side and the ring outer circumference side. In the claddings 21 and 26, the spaces may partially be formed on the ring inner circumference side and the ring outer circumference side. The same holds true for the case in which the cladding whose refractive index is lower than those of the cores 11 and 16 is laminated in the upper surfaces of the cores 11 and 16 on the side opposite from the substrate 31.

The optical resonator of the first to fourth embodiments may be replaced with a multiple optical resonator having the nested structure. In the ring multiple optical resonator, the oscillation is generated at a common resonant frequency in the plural rings, so that the longitudinal mode generated in the ring optical resonator can be reduced.

Sixth Embodiment

In order to efficiently inject the charges in the core constituting the ring optical resonator, desirably an electrode is formed such that a surface that is in contact with the core is widened as much as possible.

FIG. 8 illustrates an example of a light emitting device including an electrode. FIG. 8(A) is a plan view of the light emitting device including the electrode, and FIG. 8(B) is a sectional view taken on a line A-B of FIG. 8(A). In FIG. 8, the cladding 21 in which the spaces are formed on the ring inner circumference side and the ring outer circumference side is laminated on the substrate 31, and the core 11, an outer circumferential electrode 41, and an inner circumferential electrode 42 are formed on the cladding 21.

In order to efficiently inject the charges in the core 11, preferably the cladding 21 is made of a nonconducting material such as $SiO_2$. Because the charges are injected in the core 11 from the outer circumferential electrode 41 and inner circumferential electrode 42 on both sides of the core 11, the holes and electrons are coupled at shortest distance in the core 11 to emit the light.

When the electrode structure is devised, uniformity of the light emission collapses by localizing the injection of the charges in the core, thereby obtaining the coherent light emission.

Figures 9A, 9B:
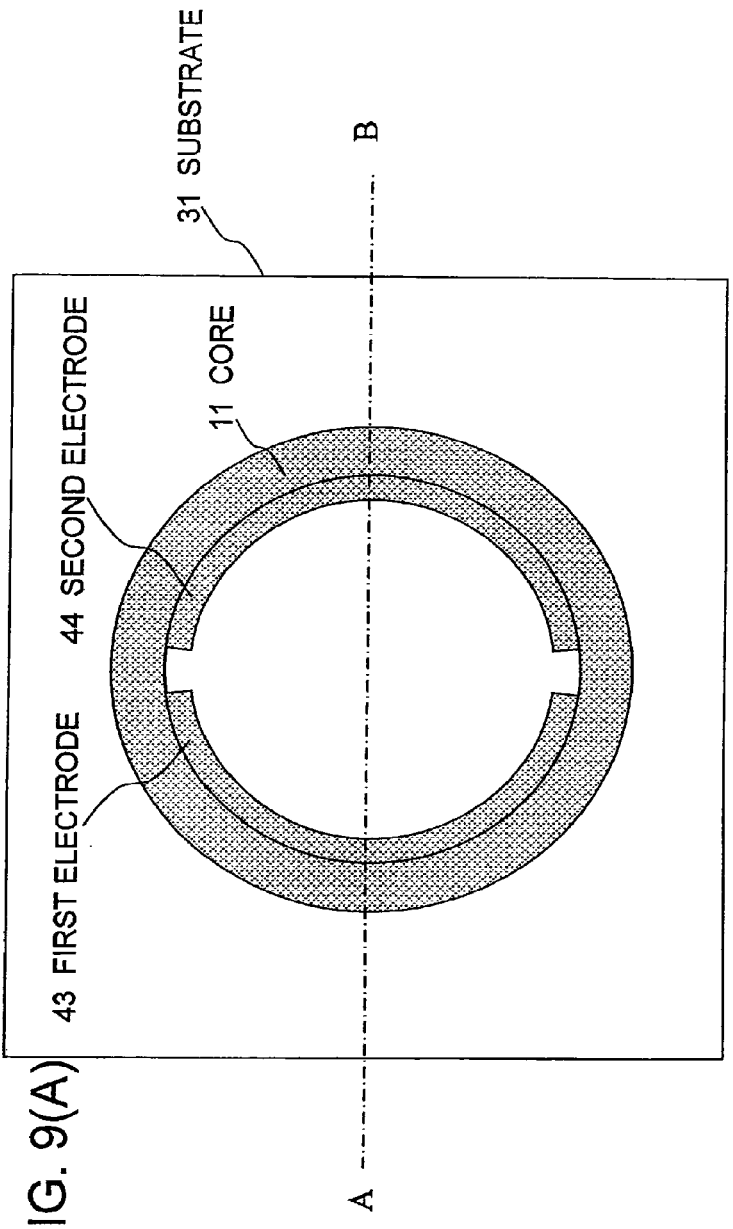
FIG. 9(A) is a plan view of a light emitting device according to an embodiment of the invention.
FIG. 9(B) is a sectional view of the light emitting device of the embodiment.

FIG. 9 illustrates an example of a light emitting device including an electrode. FIG. 9(A) is a plan view of the light emitting device including the electrode, and FIG. 9(B) is a sectional view taken on a line A-B of FIG. 9(A). In FIG. 9, the cladding 21 in which the spaces are formed on the ring inner circumference side and the ring outer circumference side is laminated on the substrate 31, the core 11 is formed on the cladding 21, and a first electrode 43 and a second electrode 44 are formed on the ring inner circumference side of the core 11 on the cladding 21.

Because the charges are injected from the first electrode 43 and the second electrode 44, the charges are localized, and only the even-numbered mode is excited to decrease the number of modes, thereby improving the contribution of the charges to the light emission. In the sixth embodiment, the electrode is divided into two electrodes. For example, when the electrode is divided into n electrodes, an n-order mode and a high-order mode thereof are excited. When the electrode is divided into plural electrodes, because the number of modes is further decreased, the contribution of the charges to the light emission is further improved.

Seventh Embodiment

The light emitting device having the similar configuration can be formed when the ring optical resonator of the light emitting device is replaced with a disk-shaped optical resonator. FIG. 10 illustrates an example of a light emitting device including a disk-shaped optical resonator. FIG. 10(A) is a perspective view of the light emitting device of the seventh embodiment, and FIG. 10(B) is a sectional view taken on a line A-B of FIG. 10(A). A disk-shaped cladding 27 and a disk-shaped core 17 are laminated on the substrate 31. The cladding 27 and the disk outer circumferential surface of the core 17 are in contact with the space. In FIG. 10, although the upper surface of the core 17 is the space, the cladding whose refractive index is lower than that of the core 17 may be laminated in the upper surface of the core 17.

The confinement effect of the light emitted in the core 17 is obtained when the outer circumferential surface of the core 17 is in contact with the space. When the outer circumferential surface of the cladding 27 is in contact with the space, a ratio in which the evanescent wave leaking out from the core 17 is converted into the radiation mode and released can be reduced.

FIG. 11 illustrates an example of a light emitting device having a disk-shaped optical resonator including an electrode. FIG. 11(A) is a plan view of the light emitting device including the electrode, and FIG. 11(B) is a sectional view taken on a line A-B of FIG. 11(A). The disk-shaped cladding 27 and the disk-shaped core 17 are laminated on the substrate 31. The cladding 27 and the ring outer circumferential surface of the core 17 are in contact with the space. An upper electrode 45 is provided on the upper surface of the core 17, a lower electrode 46 is provided on the outer circumferential side face of the core 17, and the charges are injected from the upper electrode 45 and lower electrode 46.

When the cladding 27 is made of the nonconducting material such as $SiO_2$, preferably the structure of FIG. 11 is adopted. When the cladding 27 is made of the semiconductor, the cladding 27 may be used as the lower electrode.

For the disk-shaped optical resonator, because a whispering gallery mode is generated, many emission peaks are generated compared with the emission spectrum of FIG. 2. When the number of emission peaks is increased, a probability of the recoupling in the unnecessary mode of the injected charges is unfortunately increased. However, the plural vertical grooves or vertical projections are formed in the ring outer circumferential surface of the core so as to become the singular points having the effective refractive indices, thereby effectively decreasing the number of longitudinal modes.

Alternatively, the electrode may be divided to decrease the number of generated longitudinal modes. For example, in FIG. 11, the lower electrode 46 is eliminated to divide the upper electrode 45 into plural electrodes, or the lower electrode 46 is eliminated to divide the lower electrode 46 into plural electrodes, which allows the number of longitudinal modes to be decreased. For example, when the electrode is divided into n electrodes, an n-order mode and a high-order mode thereof are excited.

Eighth Embodiment

Because the laser oscillation of the light emitting device including the ring optical resonator is generated in the ring core, the light emitted from the core is radiated in the direction of the tangent to the ring. A structure in which the radiated light is emitted in the upper surface direction of the substrate is required in the vertical outgoing element.

FIG. 12 illustrates an example of a light emitting device including a reflecting wall. FIG. 12(A) is a plan view of the light emitting device including the reflecting wall of the eighth embodiment, and FIG. 12(B) is a sectional view taken on a line A-B of FIG. 12(A). The configuration of the optical resonator of FIG. 12 is similar to that of the first to seventh embodiments. For example, as illustrated in FIG. 12, the ring cladding 21 and the core 11 are laminated on the substrate 31. The cladding 21 and the outer circumferential surface of the core 11 are in contact with the space. A reflecting wall 61 is provided outside the outer circumference of the optical resonator, and the outgoing light radiated from the optical resonator is reflected in the upper surface direction of the substrate 31.

The reflecting wall 61 can be formed by the etching. The etching is not the perpendicular etching, but an angle of 45 degrees can be provided by the use of isotropic etching.

The light emitted from the ring optical resonator is radiated in the direction of the tangent to the ring. When the optical resonator and the reflecting wall 61 are located close to each other, the radiated outgoing light is not reflected in the direction at a right angle to the upper surface of the substrate 31, but the outgoing light is reflected in the oblique direction. Therefore, desirably the reflecting wall 61 is distant from the optical resonator. For example, an angle formed between the tangent of the optical resonator and the center line of the outer circumferential circle constituting the reflecting wall 61 is equal to or lower than 10 degrees.

Figures 13A, 13B:
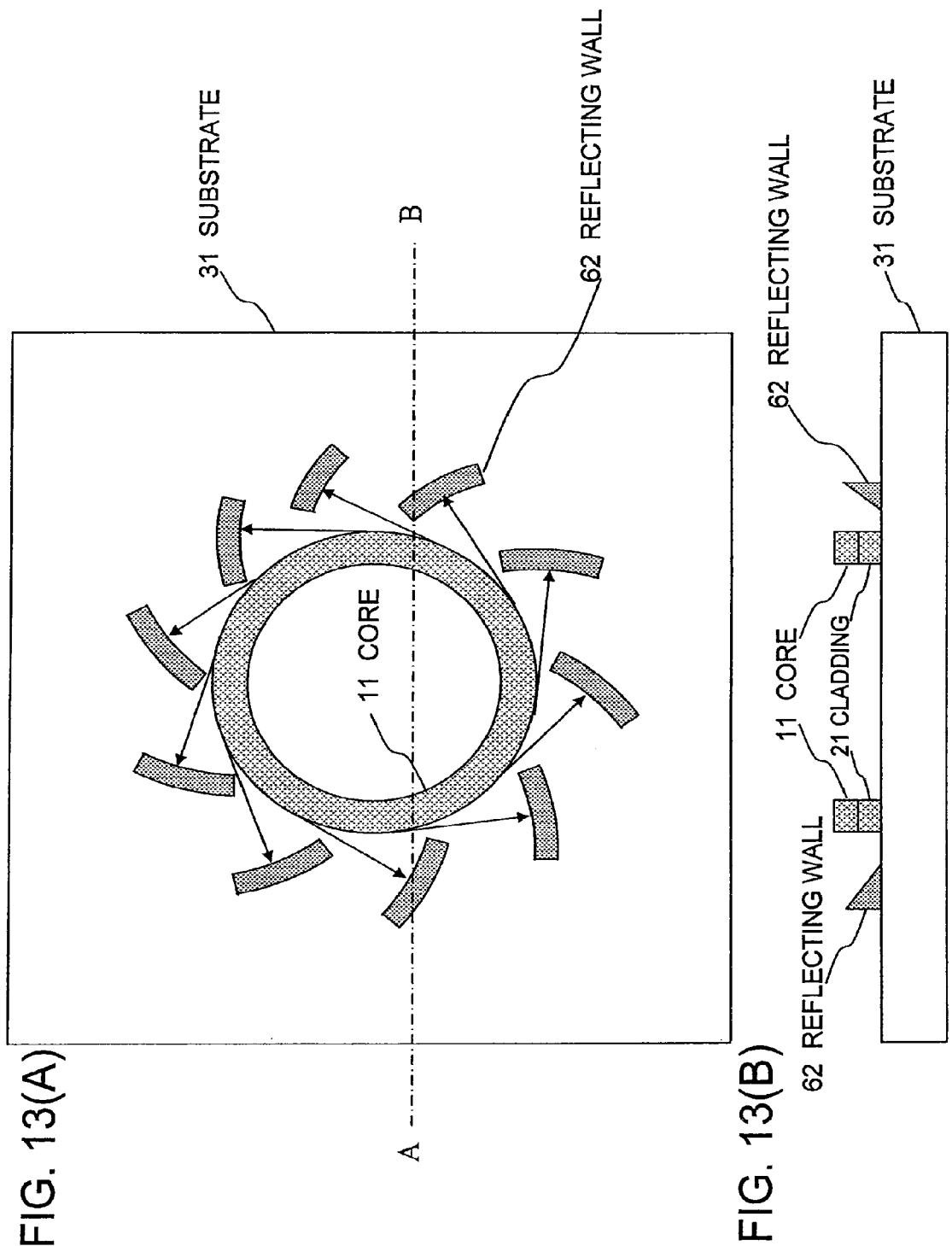
FIG. 13(A) is a plan view of a light emitting device according to an embodiment of the invention.
FIG. 13(B) is a sectional view of the light emitting device of the embodiment.

The outgoing light from the ring optical resonator is radiated in the direction of the tangent to the ring outer circumferential circle. Desirably the reflecting wall is divided in order to reflect the outgoing light, radiated in the tangential direction, in the direction at a right angle to the upper surface of the substrate. FIG. 13 illustrates an example of a light emitting device including a ring optical resonator and divided reflecting walls. FIG. 13(A) is a plan view of the light emitting device including the reflecting wall of the eighth embodiment, and FIG. 13(B) is a sectional view taken on a line A-B of FIG. 13(A). The configuration of the optical resonator of FIG. 13 is similar to that of the first to seventh embodiments. For example, as illustrated in FIG. 13, the ring cladding 21 and the core 11 are laminated on the substrate 31. The cladding 21 and the outer circumferential surface of the core 11 are in contact with the space. A reflecting wall 62 is provided outside the ring of the optical resonator, and the outgoing light radiated from the optical resonator is reflected in the upper surface direction of the substrate 31. An intersection line of the reflecting wall 62 and the substrate 31 is formed by a curved line that becomes a right angle to the tangent to the outer circumferential surface of the core 11. Further, the reflecting wall 62 is configured to always reflect the outgoing light from the optical resonator in the direction at a right angle to the upper surface of the substrate. In the light emitting device having the configuration of FIG. 13, the radiated outgoing light is reflected in the direction at a right angle to the upper surface of the substrate 31.

FIG. 14 illustrates an example of a light emitting device including a diffraction grating. FIG. 14(A) is a plan view of the light emitting device including the diffraction grating of the eighth embodiment, and FIG. 14(B) is a sectional view taken on a line A-B of FIG. 14(A). The configuration of the optical resonator of FIG. 14 is similar to that of the first to seventh embodiments. For example, as illustrated in FIG. 14, the ring cladding 21 and the core 11 are laminated on the substrate 31. The cladding 21 and the outer circumferential surface of the core 11 are in contact with the space. A diffraction grating 63 is provided outside the ring of the optical resonator, and the outgoing light radiated from the optical resonator is diffracted in the upper surface direction of the substrate 31.

Assuming that $\lambda$ is a wavelength of the outgoing light, it is necessary that the diffraction grating 63 have a period of $\lambda/4$ in a traveling direction of the outgoing light from the optical resonator.

The outgoing light from the ring optical resonator is radiated in the direction of the tangent to the ring. When the optical resonator and the diffraction grating 63 are located close to each other, the radiated outgoing light is not diffracted in the direction at a right angle to the upper surface of the substrate 31, but the outgoing light is diffracted in the oblique direction. Therefore, desirably the diffraction grating 63 is distant from the optical resonator. For example, an angle formed between the tangent of the optical resonator and the center line of the outer circumferential circle constituting the diffraction grating 63 is equal to or lower than 10 degrees.

Figures 15A, 15B:
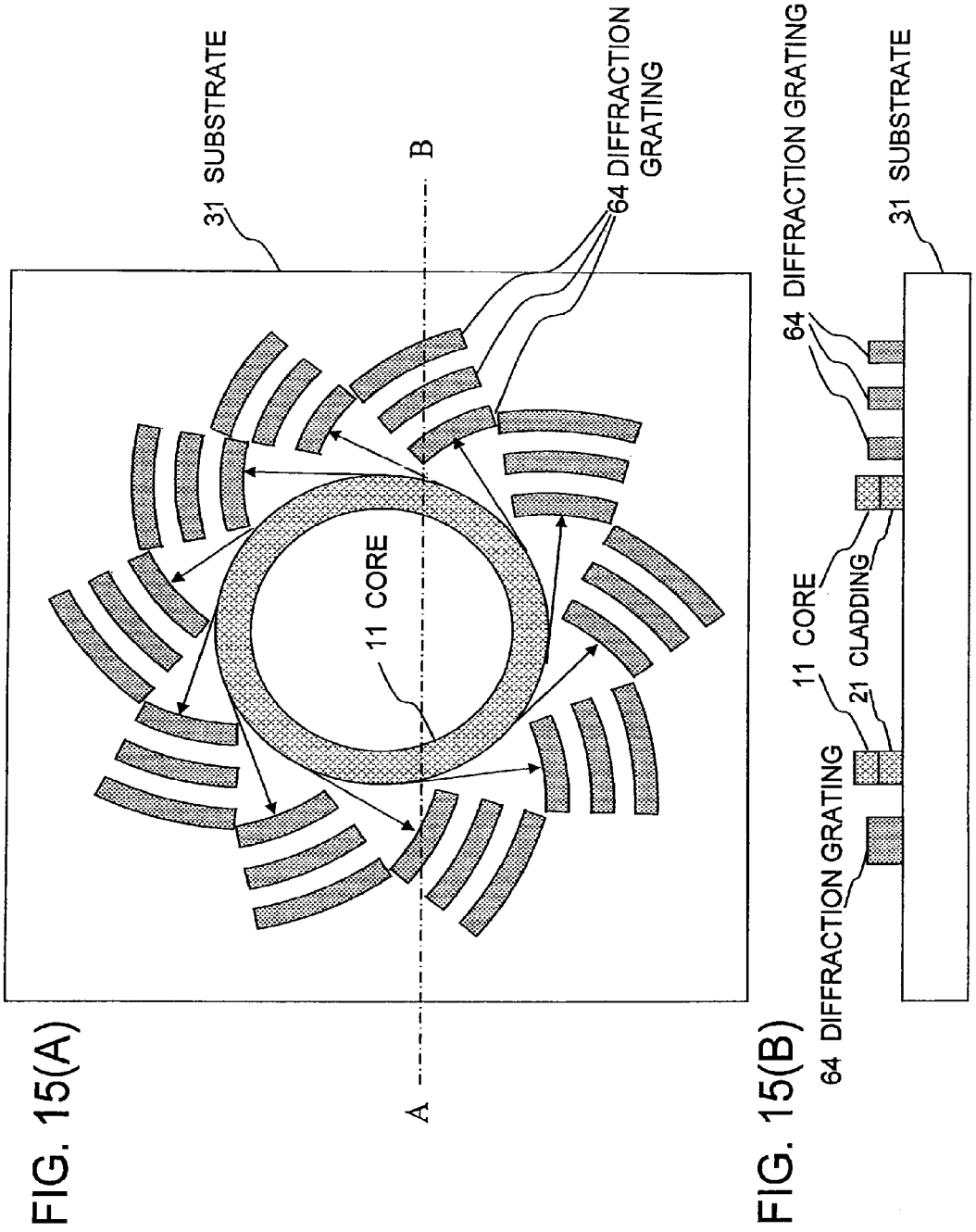
FIG. 15(A) is a plan view of a light emitting device according to an embodiment of the invention.
FIG. 15(B) is a sectional view of the light emitting device of the embodiment.

The outgoing light from the ring optical resonator is radiated in the direction of the tangent to the ring outer circumferential circle. Desirably the diffraction grating is divided in order to diffract the outgoing light, radiated in the tangential direction, in the direction at a right angle to the upper surface of the substrate. FIG. 15 illustrates an example of a light emitting device including a ring optical resonator and divided diffraction gratings. FIG. 15(A) is a plan view of the light emitting device including the diffraction grating of the eighth embodiment, and FIG. 15(B) is a sectional view taken on a line A-B of FIG. 15(A). The configuration of the optical resonator of FIG. 15 is similar to that of the first to seventh embodiments. For example, as illustrated in FIG. 15, the ring cladding 21 and the core 11 are laminated on the substrate 31. The cladding 21 and the outer circumferential surface of the core 11 are in contact with the space. A diffraction grating 64 is provided outside the ring of the optical resonator, and the outgoing light radiated from the optical resonator is reflected in the upper surface direction of the substrate 31. The diffraction grating 64 is formed by a curved line that becomes a right angle to the tangent to the outer circumferential surface of the core 11. Assuming that $\lambda$ is a wavelength of the outgoing light, it is possible that the diffraction grating 64 always have a period of $\lambda/4$ in the traveling direction of the outgoing light from the optical resonator. In the light emitting device having the configuration of FIG. 15, the radiated outgoing light is diffracted in the direction at aright angle to the upper surface of the substrate 31.

In the perpendicular outgoing light emitting device having the structure in which the radiated light is emitted in the upper surface direction of the substrate, the light emitting device of the invention and the semiconductor integrated circuit in which the semiconductor circuit is formed are easily prepared on the same substrate.

Ninth Embodiment

Because the oscillation of the light emitting device including the ring optical resonator is generated in the ring core, the outgoing light from the ring is radiated in the direction of the tangent to the ring. The structure in which the radiated outgoing light is output on the substrate surface or the structure in which the input light guided on the substrate surface is coupled with the ring resonator is required in the planar optical circuit.

FIG. 16 illustrates an example of a light emitting device including an input waveguide and an output waveguide. FIG. 16(A) is a perspective view of the light emitting device including the input waveguide and the output waveguide of the ninth embodiment, and FIG. 16(B) is a sectional view taken on a line A-B of FIG. 16(A). The configuration of the optical resonator of FIG. 16 is similar to that of the first to seventh embodiments. For example, as illustrated in FIG. 16, the ring cladding 21 and the core 11 are laminated on the substrate 31. The cladding 21 and the ring outer circumferential surface of the core 11 are in contact with the space.

An input waveguide including a core 71 and a cladding 72 is provided outside the ring of the optical resonator, and the evanescent wave coupling of the input light from the input waveguide with the optical resonator is performed. An output waveguide including a core 73 and a cladding 74 is provided outside the ring of the optical resonator, and the evanescent wave coupling of the outgoing light radiated from the optical resonator with the output waveguide is performed. The orientation of the input light of the input waveguide, the orientation of the propagating light of the optical resonator, and the orientation of the outgoing light of the output waveguide are set to be able to perform the coupling as illustrated in FIG. 16. For example, the light is fed from the input waveguide toward an arrow direction of FIG. 16, and the optical resonator can act as the optical amplifier. At this point, in the optical resonator of FIG. 16, the light is amplified in the arrow direction.

In the ninth embodiment, the optical resonator includes both the input waveguide and the output waveguide. The optical resonator may include only the input waveguide when only the light is fed into the optical resonator, and may include only the output waveguide when only the light is supplied from the optical resonator.

In the light emitting device including the planar optical circuit that feeds or supplies the radiated light into or from the waveguide on the substrate, the light emitting device of the invention and the semiconductor integrated circuit in which the semiconductor circuit is formed are easily prepared on the same substrate.

INDUSTRIAL APPLICABILITY

Because the light emitting device of the invention can generate the laser oscillation, the light emitting device can be used as the device having the functions of light emission and amplification in the semiconductor integrated circuit.

The invention claimed is:

1. A light emitting device comprising a ring optical resonator laminated on a substrate,
    wherein the optical resonator comprises: a core that is made of a semiconductor through which light propagates; and a cladding that is laminated on at least the substrate side in the substrate side of a lamination direction with respect to the core and a side opposite the substrate side,
    at least a ring inner circumference side and a ring outer circumference side of the core are covered with a space or a transparent body whose refractive index is lower than that of the cladding,
    a ring inner circumference side and a ring outer circumference side of the cladding are partially covered with the space or the transparent body whose refractive index is lower than that of the cladding; and
    in the cladding in a direction parallel to the substrate surface, a width on a side opposite from the core is narrower than a width on the core side.

2. A light emitting device comprising a ring optical resonator laminated on a substrate,
    wherein the optical resonator comprises: a core that is made of a semiconductor through which light propagates; and a cladding that is laminated on at least the substrate side in the substrate side of a lamination direction with respect to the core and a side opposite the substrate side,
    at least a ring inner circumference side and a ring outer circumference side of the core are covered with a space or a transparent body whose refractive index is lower than that of the cladding,
    a ring inner circumference side and a ring outer circumference side of the cladding are partially covered with the space or the transparent body whose refractive index is lower than that of the cladding; and
    the core partially includes a singular point having an effective refractive index.

3. A light emitting device comprising a ring optical resonator laminated on a substrate,
wherein the optical resonator comprises: a core that is made of a semiconductor through which light propagates; and a cladding that is laminated on at least the substrate side in the substrate side of a lamination direction with respect to the core and a side opposite the substrate side,
at least a ring inner circumference side and a ring outer circumference side of the core are covered with a space or a transparent body whose refractive index is lower than that of the cladding,
a ring inner circumference side and a ring outer circumference side of the cladding are partially covered with the space or the transparent body whose refractive index is lower than that of the cladding; and
the optical resonator is a ring multiple optical resonator having a nested structure.

4. A light emitting device comprising a ring optical resonator laminated on a substrate,
wherein the optical resonator comprises: a core that is made of a semiconductor through which light propagates; and a cladding that is laminated on at least the substrate side in the substrate side of a lamination direction with respect to the core and a side opposite the substrate side,
at least a ring inner circumference side and a ring outer circumference side of the core are covered with a space or a transparent body whose refractive index is lower than that of the cladding,
a ring inner circumference side and a ring outer circumference side of the cladding are partially covered with the space or the transparent body whose refractive index is lower than that of the cladding; and
comprising electrodes that supply charges onto the cladding in a ring inner circumferential portion and a ring outer circumferential portion of the core, respectively.

5. A light emitting device comprising a ring optical resonator laminated on a substrate,
wherein the optical resonator comprises: a core that is made of a semiconductor through which light propagates; and a cladding that is laminated on at least the substrate side in the substrate side of a lamination direction with respect to the core and a side opposite the substrate side,
at least a ring inner circumference side and a ring outer circumference side of the core are covered with a space or a transparent body whose refractive index is lower than that of the cladding,
a ring inner circumference side and a ring outer circumference side of the cladding are partially covered with the space or the transparent body whose refractive index is lower than that of the cladding; and
comprising a plurality of electrodes that supply charges onto the cladding in ring inner circumferential portion of the core.

6. A light emitting device comprising a ring optical resonator laminated on a substrate,
wherein the optical resonator comprises: a core that is made of a semiconductor through which light propagates; and a cladding that is laminated on at least the substrate side in the substrate side of a lamination direction with respect to the core and a side opposite the substrate side,
at least a ring inner circumference side and a ring outer circumference side of the core are covered with a space or a transparent body whose refractive index is lower than that of the cladding,
a ring inner circumference side and a ring outer circumference side of the cladding are partially covered with the space or the transparent body whose refractive index is lower than that of the cladding; and
comprising a diffraction grating surrounding the optical resonator on the substrate, the diffraction grating diffracting outgoing light radiated from the optical resonator toward an upper surface direction of the substrate.

7. A light emitting device comprising a disk-shaped optical resonator laminated on a substrate,
wherein the optical resonator comprises: a core that is made of a semiconductor through which light propagates; and a cladding that is laminated on at least the substrate side in the substrate side of a lamination direction with respect to the core and a side opposite the substrate side,
at least a disk outer circumference side of the core is covered with a space or a transparent body whose refractive index is lower than that of the cladding,
a disk outer circumferential side of the cladding is partially covered with the space or the transparent body whose refractive index is lower than that of the cladding, and
comprising electrodes that supply charges onto a surface of the core on the side opposite from the substrate and the cladding in the disk outer circumferential portion of the core, respectively.

8. A light emitting device comprising a disk-shaped optical resonator laminated on a substrate,
wherein the optical resonator comprises: a core that is made of a semiconductor through which light propagates; and a cladding that is laminated on at least the substrate side in the substrate side of a lamination direction with respect to the core and a side opposite the substrate side,
at least a disk outer circumference side of the core is covered with a space or a transparent body whose refractive index is lower than that of the cladding,
a disk outer circumferential side of the cladding is partially covered with the space or the transparent body whose refractive index is lower than that of the cladding,
comprising a diffraction grating surrounding the optical resonator on the substrate, the diffraction grating diffracting outgoing light radiated from the optical resonator toward an upper surface direction of the substrate.

\* \* \* \* \*